(12) United States Patent
Ichihara et al.

(10) Patent No.: US 11,742,872 B2
(45) Date of Patent: Aug. 29, 2023

(54) AD CONVERTER

(71) Applicant: Asahi Kasei Microdevices Corporation, Tokyo (JP)

(72) Inventors: Eizo Ichihara, Tokyo (JP); Shintaro Kawazoe, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 2 days.

(21) Appl. No.: 17/728,985

(22) Filed: Apr. 26, 2022

(65) Prior Publication Data

US 2022/0360274 A1 Nov. 10, 2022

(30) Foreign Application Priority Data

May 6, 2021 (JP) ................. 2021-078501

(51) Int. Cl.
| H03M 1/12 | (2006.01) |
| H03M 1/36 | (2006.01) |
| H03M 3/00 | (2006.01) |
| H03M 1/50 | (2006.01) |
| H03M 1/08 | (2006.01) |

(52) U.S. Cl.
CPC ....... *H03M 1/1245* (2013.01); *H03M 1/0854* (2013.01); *H03M 1/361* (2013.01); *H03M 1/50* (2013.01); *H03M 3/39* (2013.01)

(58) Field of Classification Search
CPC ...... H03M 1/1245; H03M 1/361; H03M 1/50; H03M 1/0854

USPC ................. 341/155, 118, 120, 143
See application file for complete search history.

(56) References Cited

U.S. PATENT DOCUMENTS

| 4,888,587 | A | | 12/1989 | Kuraishi | |
| 5,208,594 | A | * | 5/1993 | Yamazaki | ............... H03M 3/50 |
| | | | | | 341/110 |
| 7,298,308 | B1 | * | 11/2007 | Rueger | ................... H03M 3/32 |
| | | | | | 341/143 |
| 2013/0278059 | A1 | | 10/2013 | Liu | |
| 2019/0296757 | A1 | | 9/2019 | Kuwahara | |

FOREIGN PATENT DOCUMENTS

| JP | 2010171484 A | 8/2010 |
| JP | 2013187993 A | 9/2013 |
| JP | 2017216523 A | 12/2017 |

* cited by examiner

*Primary Examiner* — Peguy Jean Pierre

(57) ABSTRACT

Provided is an AD converter, including: an analog signal input circuit, configured to be input with an analog input signal, and output a first analog output signal based on the analog input signal and a second analog output signal based on the analog input signal at different timing; an integral circuit, configured to integrate the first analog output signal and the second analog output signal and output the first integral signal and the second integral signal; a predictive circuit, configured to predict an integral signal output after the output by the integral circuit based on the first integral signal and the second integral signal output by the integral circuit, and output a predictive integral signal; and a quantization circuit, configured to generate a digital signal with the predictive integral signal quantized.

16 Claims, 18 Drawing Sheets

(a) 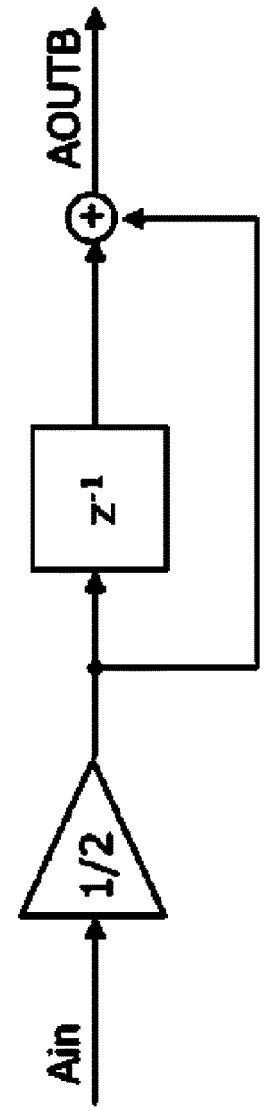
(b) 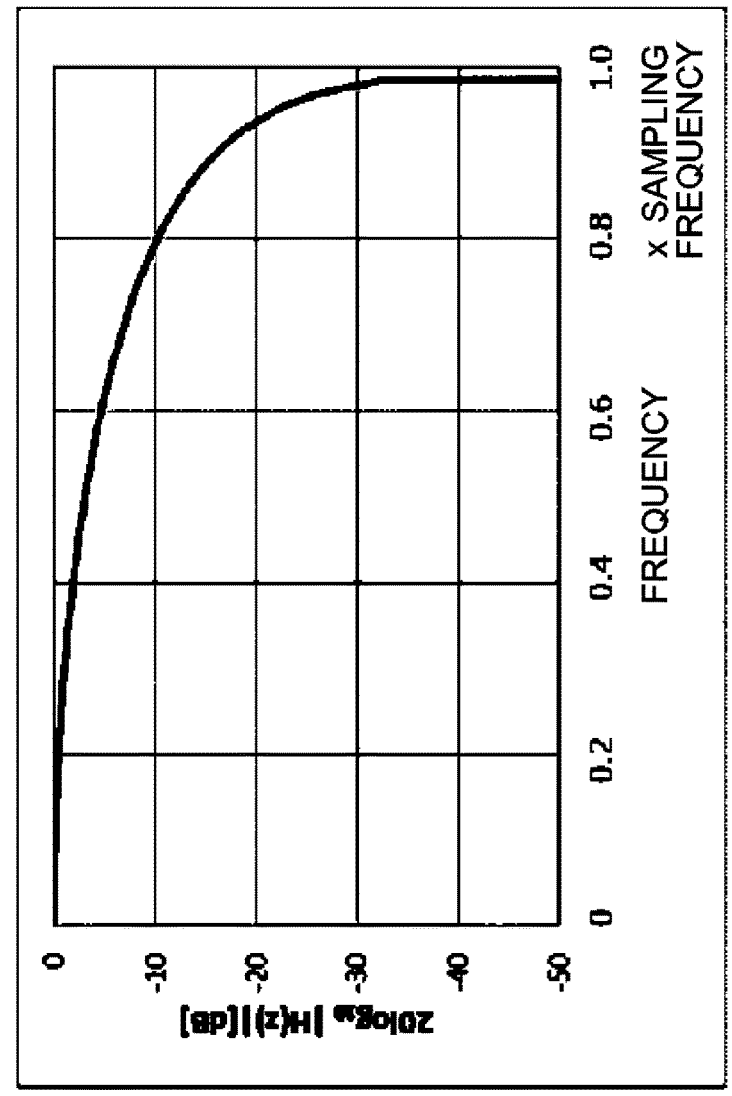
FIG.7

AD CONVERTER

The contents of the following Japanese patent application(s) are incorporated herein by reference:
NO. 2021-078501 filed in JP on May 6, 2021.

BACKGROUND

1. Technical Field

The present invention relates to an AD converter.

2. Related Art

Conventionally, an AD converter with a quantizer and an integrator and a first-order delta-sigma modulator that converts the input analog signal to a digital signal is known. In Patent Document 1, It is disclosed that the AD converter divides one integration into two integrations, the first integration and the second integration.

Patent Document 1: Japanese Patent Application Publication No. 2017-216523

BRIEF DESCRIPTION OF THE DRAWINGS

FIG. 7 illustrates (a) a block of a first order moving average filter and (b) frequency characteristics.

DESCRIPTION OF EXEMPLARY EMBODIMENTS

Hereinafter, the present invention will be described through embodiments of the invention, but the following embodiments do not limit the claimed invention. And all the combinations of the features described in the embodiment(s) are not necessarily essential to means provided by aspects of the invention.

Figure 1:
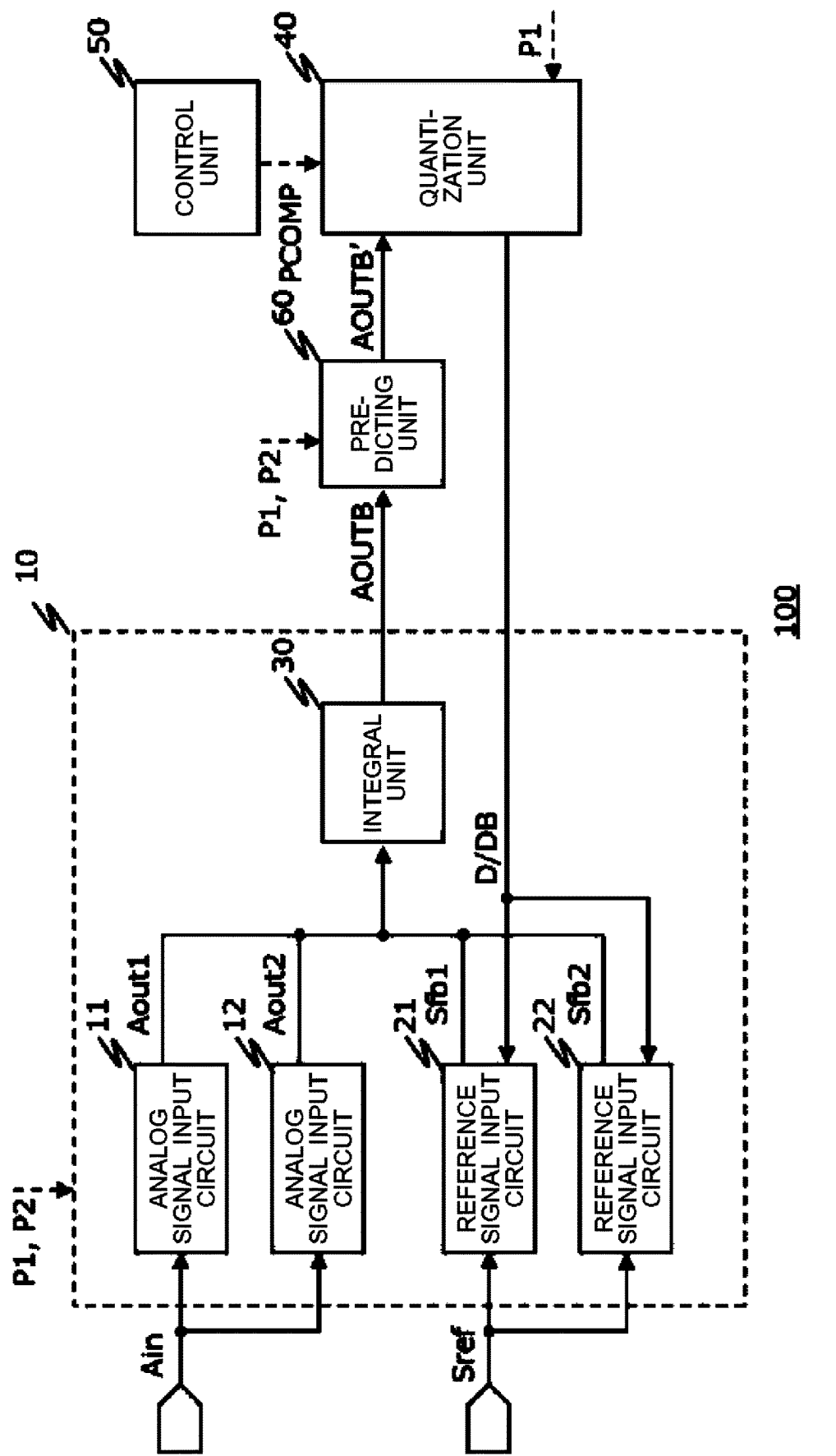
FIG. 1 illustrates an overview of the configuration of the AD converter 100 in the first embodiment.

FIG. 1 illustrates an overview of a configuration of an AD converter 100 in a first embodiment. The AD converter 100 divides a Mth conversion period (M is an integer equal to or greater than 2) into X periods (X is an integer of 2 or more) and during the conversion period repeatedly performs integral operations and sampling operations to quantize the input analog input signal Ain into bit data for output. For example, the AD converter 100 is an AD converter with a first-order delta-sigma modulator, but it may also be an AD converter with a high-order delta-sigma modulator. The AD converter 100 includes an integrator 10 (an integral circuit in the present application), a predicting unit 60 (a predictive circuit in the present application), a quantization unit 40 (a quantization circuit in the present application) and a control unit 50. The integrator 10 includes a first analog signal input circuit 11, a second analog signal input circuit 12, a first reference signal input circuit 21, a second reference signal input circuit 22 and an integral unit 30. The integrator 10, the predicting unit 60, and the quantization unit 40 are input with at least one of the clock signals P1 and P2 and operate according to the clock signals.

The first analog signal input circuit 11 is connected to the input terminal and the integral unit 30 of the AD converter 100, and is input with an analog input signal Ain from the input terminal during each of the X periods equally divided from the conversion period, and outputs a first analog output signal Aout1 to the integral unit 30. The second analog signal input circuit 12 is connected to the input terminal and the integral unit 30, and input with an analog input signal Ain at the timing different from the first analog signal input circuit 11, and outputs a second analog output signal Aout2 to the integral unit 30. The first analog signal input circuit 11 and the second analog signal input circuit 12 are connected to the common integral unit 30, and sample the analog input signal Ain at different timings from each other. The first analog signal input circuit 11 and the second analog signal input circuit 12 may alternately sample and alternately output analog output signals Aout1 and Aout2 to the integral unit 30. For example, during the L1th period of the Mth conversion period (L1 is an integer from 1 to X−1), the first analog signal input circuit outputs the first analog output signal Aout1 to the integral unit 30, and the second analog signal input circuit 12 samples the analog input signal Ain, and during the L2th period of the Mth conversion period (L2 is an integer greater than L1 and equal to or less than X−1), the first analog signal input circuit 11 samples the analog input signal Ain, and the second analog signal input circuit 12 outputs the second analog output signal Aout2 to the integral unit 30.

The first reference signal input circuit 21 is connected to the integral unit 30 and the quantization unit 40, input with a digital signal D an inverting signal DB and a reference input signal Sref of the digital signal D from the quantization unit 40. The first reference signal input circuit 21 generates a positive or negative feedback signal ±Sfb1 from the input signal, and outputs to the integral unit 30. The first reference signal input circuit 21 may have a DA converter that converts the digital signal to an analog signal.

The second reference signal input circuit 22 is connected to the integral unit 30 and the quantization unit 40, input with a digital signal D an inverting signal DB and a reference input signal Sref of the digital signal D from the quantization unit 40. The second reference signal input circuit 22 generates a positive or negative feedback signal ±Sfb2 from the input signal, and outputs to the integral unit 30. The second reference signal input circuit 22 may have a DA converter that converts the digital signal to an analog signal. The second reference signal input circuit 22 may output a feedback signal Sfb2 at a timing different from the output out the feedback signal Sfb1 of the first reference signal input circuit 21. The first reference signal input circuit 21 and the second reference signal input circuit 22 may alternately output the feedback signals Sfb1 and Sfb2.

The integral unit 30 is connected to the predicting unit 60, and integrates the first analog output signal Aout1 and the second analog output signal Aout2, and outputs the first integral signal and the second integral signal AOUTB, which are the integral results, to the predicting unit 60. Since the first reference signal input circuit 21, the second reference signal input circuit 22, the first analog signal input circuit 11 and the second analog signal input circuit 12 are commonly connected to the input of the integral unit 30, the integral unit 30 may receive the analog output signals Aout1 and Aout2 to which the feedback signals Sfb1 and Sfb2 are added.

The integral unit 30 may integrate, at different timing, the first analog output signal Aout1 and the second analog output signal Aout2 which are input at different timing, and output the respective corresponding first integral signal AOUTB and second integral signal AOUTB. The integral unit 30 may alternately output the first integral signal AOUTB and the second integral signal AOUTB.

The predicting unit 60 is connected to the quantization unit 40, and predicts, based on the first integral signal AOUTB and the second integral signal AOUTB output by the integral unit 30, the integral signal output after the output of the first integral signal and the second integral signal by the integral unit 30. The predicting unit 60 may predict, based on the first integral signal and the second integral signal, at least one of the future first integral signal and the future second integral signal. The predicting unit 60 may predict, based on the integral signal output from the integral unit 30 in the last (Xth) period of the immediately preceding ((M−1)th) conversion period divided into X periods and the integral signal (the difference of the integral signal, for example) output from the integral unit 30 in one of the (1st to (X−1)th) periods other than the last (Xth) period of the Mth conversion period divided into X periods, or each integral signal (the difference of the integral signal, for example) in two different periods in one of the (1st to (X−1)th) periods other than the last (Xth) period of the Mth conversion period divided into X periods, the integral signal output from the integral unit 30 in the last (Xth) period of the Mth conversion period divided into X periods, and output the predictive integral signal AOUTB'. The predicting unit 60 may predict, based on the first integral signal and the second integral signal output at different timing by the integral unit 30, one of the first integral signal and the second integral signal output next to the output of the integral unit 30, and may output the predictive integral signal AOUTB', which is the predicted result, to the quantization unit 40. As one example, the predicting unit 60 may output a second predictive integral signal AOUTB', which is the predicted result of the next second integral signal AOUTB, after receiving the first integral signal AOUTB, before receiving the next second integral signal AOUTB or in between.

The quantization unit 40 generates a digital signal D that quantizes the predictive integral signal AOUTB' of the predicting unit 60 and an inverting signal DB of the digital signal D, and outputs the digital signal D and the inverting signal DB to the first reference signal input circuit 21 and the second reference signal input circuit 22. The quantization unit 40 may output the generated digital signal D to the outside of the AD converter 100.

The control unit 50 controls the quantization timing of the quantization unit 40. The control unit 50 may output the clock signal PCOMP to the quantization unit 40 to control the quantization timing in the quantization unit 40.

Figure 2:
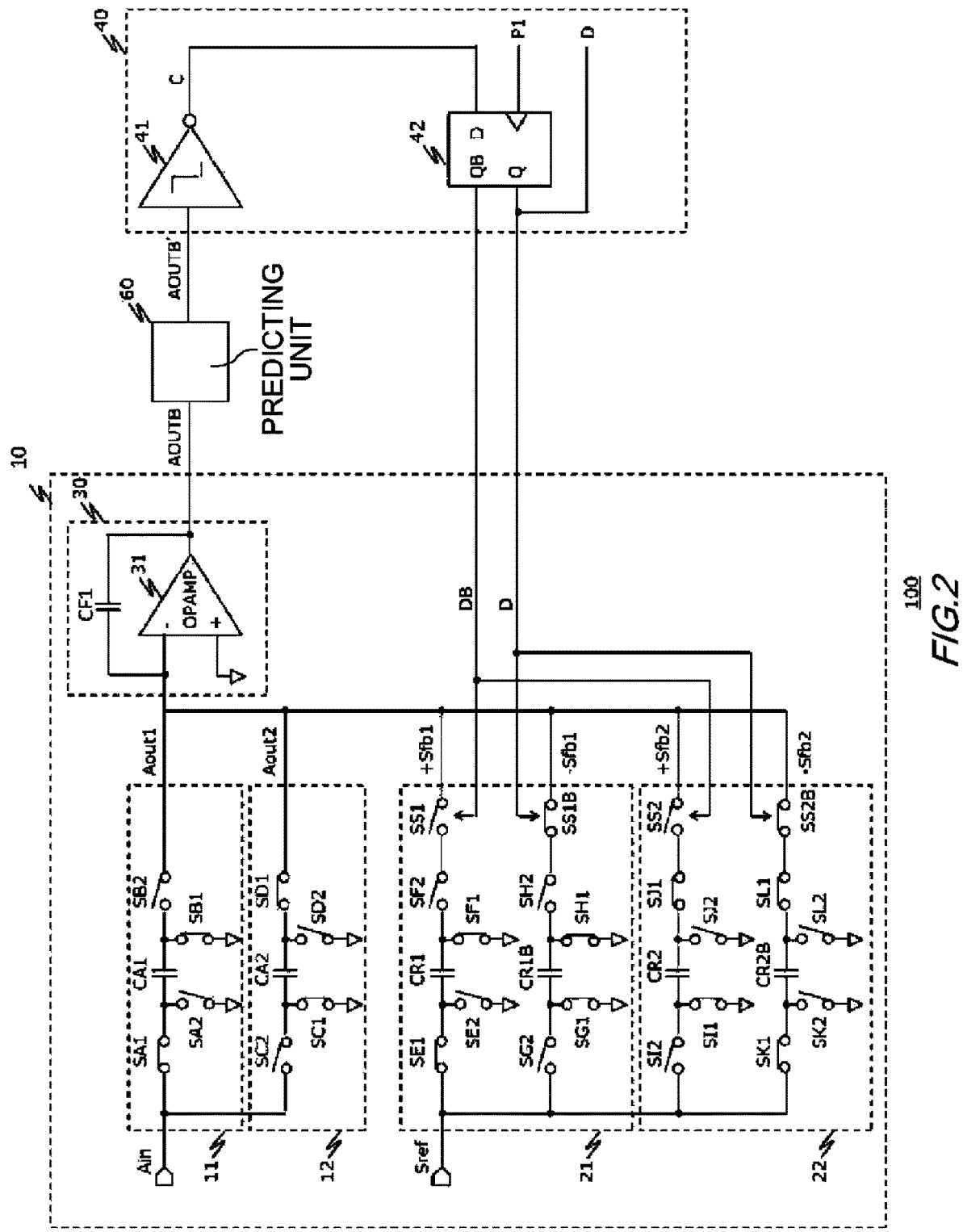
FIG. 2 illustrates a more detailed configuration of an integrator 10 and a quantization unit 40 of the AD converter 100 in the first embodiment.

FIG. 2 illustrates a more detailed configuration of the integrator 10 and the quantization unit 40 of the AD converter 100 in the first embodiment. The first analog signal input circuit 11 has a capacitor CA1, a plurality of switches SA1 and SA2 that switch the connection to one end side of the capacitor CA1 between the input terminal and the reference potential, and a plurality of switches SB1 and SB2 that switch the connection to the other end side of the capacitor CA1 between the output of the first analog signal input circuit 11 and the reference potential.

The second analog signal input circuit 12 has a capacitor CA2 connected to the capacitor CA1 in parallel, a plurality of switches SC1 and SC2 that switch the connection to one end side of the capacitor CA2 between the input terminal and the reference potential, and a plurality of switches SD1 and SD2 that switch the connection to the other end side of the capacitor CA2 between the output of the second analog signal input circuit 12 and the reference potential. Herein, the reference potential may be a predetermined potential, for example, a ground potential, and the same applies hereinafter in present specification.

The first analog signal input circuit 11 and the second analog signal input circuit 12 may output, according to the clock signals P1 and P2, the analog output signals Aout1 and Aout2 during the operating periods phi(1) and phi(2) different from each other. During the operating period phi(1), in the first analog signal input circuit 11, the switch SA1 and the switch SB1 are turned on, the switch SA2 and the switch SB2 are turned off, and in the second analog signal input circuit 12, the switch SC1 and the switch SD1 are turned on, the switch SC2 and the switch SD2 are turned off. On the other hand, during the operating period phi(2), in the first analog signal input circuit 11, the switch SA1 and the switch SB1 are turned off, the switch SA2 and the switch SB2 are turned on, and in the second analog signal input circuit 12, the switch SC1 and the switch SD1 are turned off, the switch SC2 and the switch SD2 are turned on.

The first reference signal input circuit 21 has two capacitors connected in parallel, a plurality of switches SE1, SE2, SG1 and SG2 that switch the connection to one end side of the two capacitors CR1 and CR1B between the input terminal input with the reference input signal Sref and the reference potential, a plurality of switches SF1, SF2, SH1 and SH2 that switch the connection to the other end side of the two capacitors CR1 and CR1B between the output of the first reference signal input circuit 21 and the reference potential, and a plurality of switches SS1 and SS1B that switch the output of the first reference signal input circuit 21.

The second reference signal input circuit 22 has two capacitors CR2 and CR2B connected in parallel, a plurality of switches SI1, SI2, SK1 and SK2 that switch the connection to one end side of the two capacitors CR2 and CR2B between the input terminal and the reference potential of the reference input signal Sref, a plurality of switches SJ1, SJ2, SL1 and SL2 that switch the connection to the other end side of the two capacitors CR2 and CR2B between the output and the reference potential of the second reference signal input circuit 22, and a plurality of switches SS2 and SS2B that switch the output of the second reference signal input circuit 22.

The first reference signal input circuit 21 and the second reference signal input circuit 22 may sample the electric charges during the operating periods phi(1) and phi(2) that are different from each other according to the clock signals P1 and P2. During the operating period phi(1), in the first reference signal input circuit 21, the switches SE1, SF1, SG1 and SH1 are turned on, the switches SE2, SF2, SG2 and SH2 are turned off, and in the second reference signal input circuit 22, the switches SI1, SJ1, SL1 and SK1 are turned on, the switches SI2, SJ2, SL2 and SK2 are turned off. On the other hand, during the operating period phi(2), in the first reference signal input circuit 21, the switches SE1, SF1, SG1 and SH1 are turned off, the switches SE2, SF2, SG2 and SH2 are turned on, and in the second reference signal input circuit 22, the switches SI1, SJ1, SL1 and SK1 are turned off, and the switches SI2, SJ2, SL2 and SK2 are turned on.

The switches SS1 and SS1B of the first reference signal input circuit 21 and the switches SS2 and SS2B of the second reference signal input circuit 22 are connected between the other end side and the output of the capacitors CR1 and CR1B, and control the output of the reference input signal Sref. The switch SS1 of the first reference signal input circuit 21 and switch SS2 of the second reference signal input circuit 22 are input with the inverting signal DB from the quantization unit 40, and turned on when the inverting signal DB is High (also referred to as H below), and turned off when the inverting signal DB is Low (also referred to as L below). The switch SS1B of the first reference signal input circuit 21 and the switch SS2B of the second reference signal input circuit 22 are input with the digital signal D from the quantization unit 40, and turned on when the digital signal D is H, and turned off when the digital signal D is L.

In a state where the switches SF2 and SH2 are turned on during the operating period phi(2), the first reference signal input circuit 21 connects any of the capacitor CR1 and the capacitor CR1B to the integral unit 30. On the other hand, regardless of the state of the switches SS1 and SS1B, since the switches SF2 and SH2 are turned off during the operating period phi(1), the first reference signal input circuit 21 does not connect the capacitors CR1 and CR1B to the integral unit 30.

For example, when the digital signal D from the quantization unit 40 is H, the first reference signal input circuit 21 subtracts the feedback signal Sfb from the analog output signal Aout1 by connecting the capacitor CR1B and the integral unit 30. That is, electric charges are extracted from the input of the integral unit 30 to capacitor CR1B. On the other hand, when the digital signal D from the quantization unit 40 is L, the first reference signal input circuit 21 adds the feedback signal Sfb to the analog output signal Aout1 by connecting the capacitor CR1 and the integral unit 30. That is, electric charges are transferred from the capacitor CR1B to the integral unit 30.

In a state where the switches SF2 and SH2 are turned on during the operating period phi(2), the second reference signal input circuit 22 connects any of the capacitor CR1 and the capacitor CR1B to the integral unit 30. On the other hand, regardless of the state of the switches SS1 and SS1B, since the switches SF2 and SH2 are turned off during the operating period phi(1), the first reference signal input circuit 21 does not connect the capacitors CR1 and CR1B to the integral unit 30. During the operating period phi(1), the second reference signal input circuit 22 connects any of the capacitor CR1 and the capacitor CR1B to the integral unit 30.

For example, when the digital signal D from the quantization unit 40 is H, the second reference signal input circuit 22 subtracts the feedback signal Sfb from the analog output signal Aout2 by connecting the capacitor CR2B and the integral unit 30. That is, electric charges are extracted from the input of the integral unit 30 to capacitor CR2B. On the other hand, when the digital signal D from the quantization unit 40 is L, the second reference signal input circuit 22 adds the feedback signal Sfb to the analog output signal Aout2 by connecting the capacitor CR2 and the integral unit 30. That is, electric charges are transferred from the capacitor CR2B to the integral unit 30.

The integral unit 30 includes an operational amplifier 31 and a capacitor CF1. In the operational amplifier 31, the inverting input terminal is connected to the outputs of the first analog signal input circuit 11, the second analog signal input circuit 12, the first reference signal input circuit 21 and the second reference signal input circuit 22, the non-inverting input terminal is connected to the reference potential, and the output terminal is connected to the predicting unit 60. The capacitor CF1 is provided between the inverting input terminal and the output terminal of the operational amplifier 31.

During the operating period phi(2), the integral unit 30 performs integration of the analog output signal Aout1 and the feedback signal Sfb1. Also, during the operating period phi(1), the integral unit 30 performs integration of the analog output signal Aout2 and the feedback signal Sfb2. In this way, the integral unit 30 may divide one cycle of the operating period phi(1) and the operating period phi(2) into two, and perform one integration over one cycle.

Since the integrator 10 includes the first analog signal input circuit 11 and the second analog signal input circuit 12 as an analog signal input circuit, and includes the first reference signal input circuit 21 and the second reference signal input circuit 22 as a feedback unit, the integrator 10 can respectively divide both of the analog output signal Aout and the feedback signal Sfb into two signals and perform integration by the integral unit 30. The AD converter 100 can operate with negative feedback by inputting the feedback signals Sfb1 and Sfb2 to the integral unit 30 according to the integral results of the integral unit 30.

The quantization unit 40 has a comparator 41 and a logic circuit 42. In the comparator 41, the input terminal is connected to the predicting unit 60, and the output terminal is connected to the logic circuit 42. The comparator 41 is input with the predictive integral signal AOUTB' of the predicting unit 60, and quantizes the predictive integral signal AOUTB' and generates the quantization signal C. The comparator 41 may quantize the predictive integral signal AOUTB' input at the rising time of the clock signal PCOMP to generate the quantization signal C. The comparator 41 outputs the generated quantization signal C to the logic circuit 42. In the present embodiment, the comparator 41 is a single-bit quantizer, but it may also be a multi-bit quantizer.

In the logic circuit 42, the output terminals (Q terminal and QB terminal) are connected to the first reference signal input circuit 21, the second reference signal input circuit 22 and an external apparatus. The logic circuit 42 may be input with a clock signal P1 to the clock terminal. The logic circuit 42 outputs a digital signal D according to the quantization signal C output by the comparator 41. The logic circuit 42 may be configured by a D flip-flop (DFF). The logic circuit 42 outputs the input as a digital signal D at the rising edge of the clock signal P1. The logic circuit 42 holds the same output signal until the next rising edge of the clock signal P1.

Figure 3:
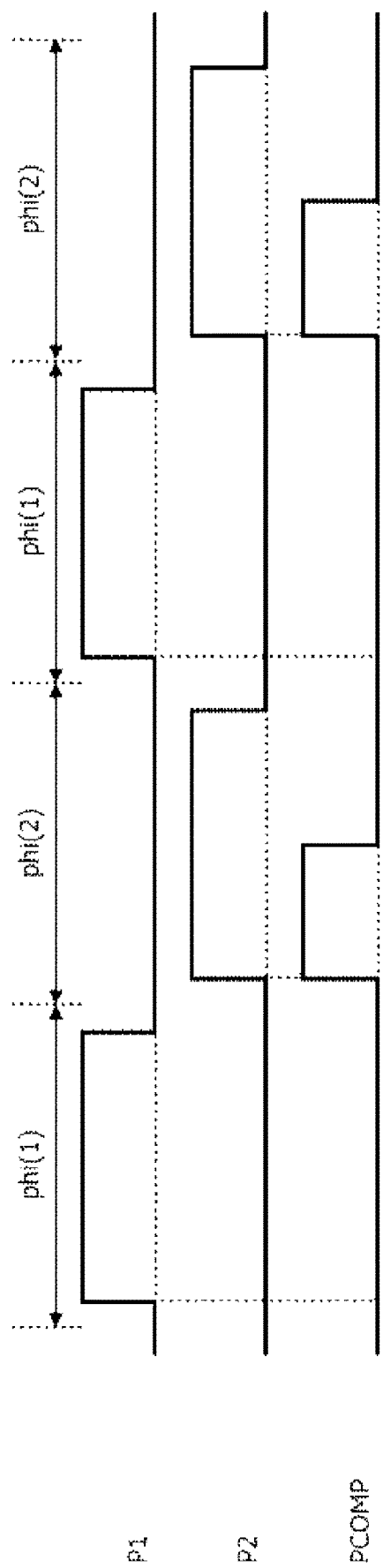
FIG. 3 illustrates one example of clock signals P1, P2, PCOMP.

FIG. 3 illustrates one example of the clock signals P1, P2, PCOMP. The clock signal P1 becomes H during the operating period phi(1), and becomes L during other periods. The clock signal P2 becomes H during the operating period phi(2), and becomes L during other periods. The clock signal PCOMP becomes H during a partial period of the operating period phi(2), and becomes L during other periods.

During the first operating period phi(2), the first analog signal input circuit 11 may output the first analog output signal Aout1 to the integral unit 30, the second analog signal input circuit 12 may sample the analog input signal Ain, and during the second operating period, the first analog signal input circuit 11 may sample the analog input signal Ain, the second analog signal input circuit 12 may output the second analog output signal Aout2 to the integral unit 30.

For example, the first analog signal input circuit 11 samples the analog input signal Ain by storing the electric charges in the capacitor CA1 according to the analog input signal Ain during the operating period phi(1), and outputs the stored electric charges to the integral unit 30 as the first analog output signal Aout 1 during the operating period phi(2). The second analog signal input circuit 12 samples the analog input signal Ain by storing the electric charges in the capacitor CA2 according to the analog input signal Ain during the operating period phi(2), and outputs the stored electric charges to the integral unit 30 as the second analog output signal Aout2 during the operating period phi(1).

The first reference signal input circuit 21 samples the reference input signal Sref by storing the electric charges in the capacitor CR1 according to the reference input signal Sref during the operating period phi(1). The capacitor CR1B resets the accumulated electric charges. In other words, the capacitor CR1B samples a zero signal intended to be zero V as electric charges. The switch SS1 is input with the signal according to the electric charges sampled by the capacitor CR1 during the operating period phi(1), and the switch SS1B is input with the signal according to the electric charges sampled by the capacitor CR1B.

The second reference signal input circuit 22 samples the reference input signal Sref by storing the electric charges in the capacitor CR2 according to the reference input signal Sref during the operating period phi(2). The capacitor CR2B resets the accumulated electric charges. In other words, the capacitor CR2B samples a zero signal intended to be zero V as electric charges. The switch SS2 is input with the signal according to the electric charges sampled by the capacitor CR2 during the operating period phi(2), and the switch SS2B is input with the signal according to the electric charges sampled by the capacitor CR2B.

In this way, the AD converter 100 may alternately repeat the first operating period phi(2), in which the first analog output signal Aout1 is integrated by the integral unit 30, and the second operating period phi(1), in which the second analog output signal Aout2 is integrated by the integral unit 30, in a time-divisional manner.

Figure 4:
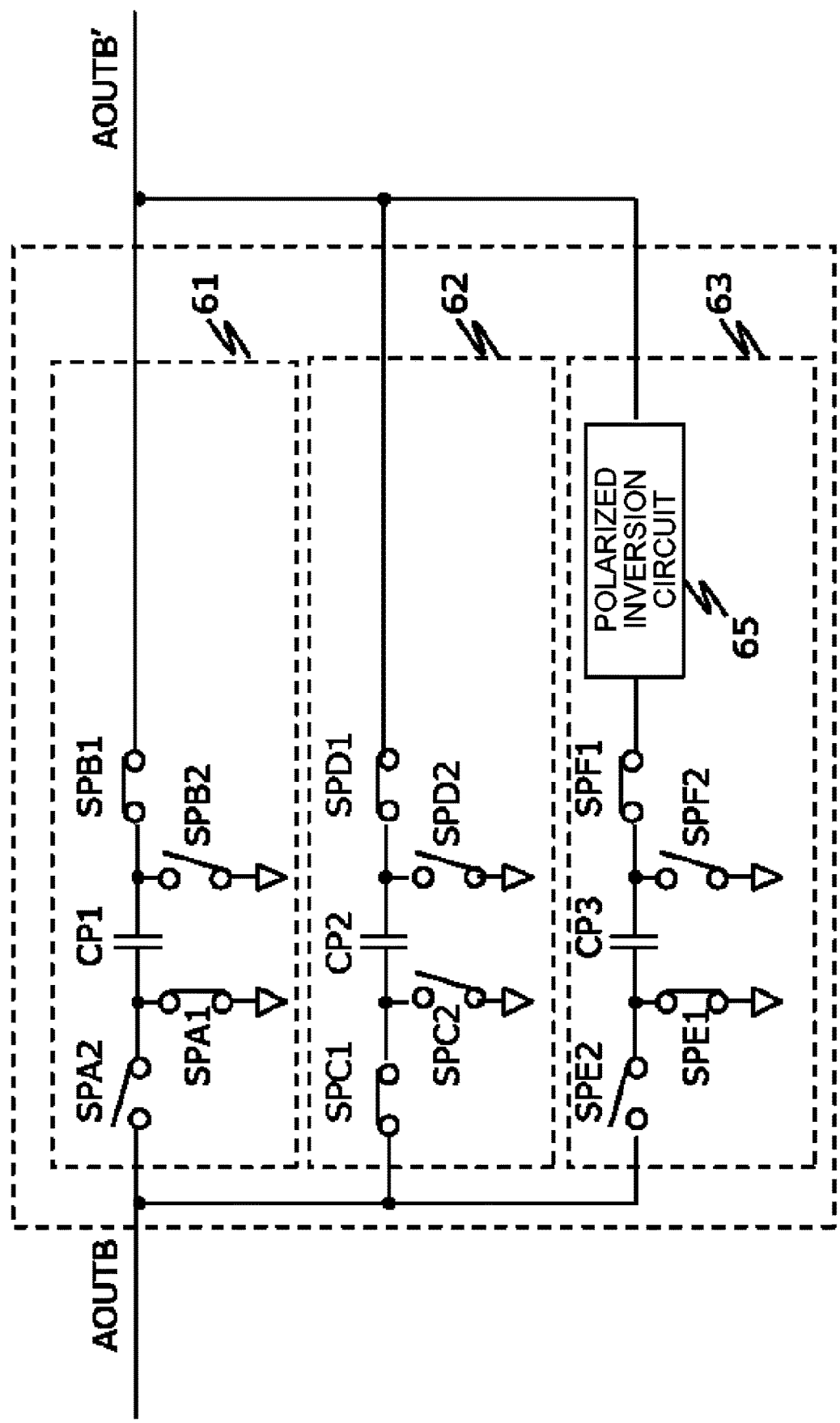
FIG. 4 illustrates one example of a specific configuration of a predicting unit 60 in the AD converter 100.

FIG. 4 illustrates one example of a specific configuration of the predicting unit 60 in the AD converter 100. The predicting unit 60 has three capacitors CP1, CP2 and CP3, a plurality of switches SPA1, SPA2, SPC1, SPC2, SPE1, SPE2, SPB1, SPB2, SPD1, SPD2, SPF1 and SPF2, and a polarized inversion circuit 65, constituting three predictive circuits 61, 62, 63. The polarized inversion circuit 65 may output the signal inverting the polarity of the input electric charges, and may be configured by an inverting amplifier.

The three capacitors CP1, CP2 and CP3 are connected in parallel between the input and the output of the predicting unit 60. The capacity value of the capacitor CP1 and the capacitor CP2 is 2C (C>0), and the capacity value of the capacitor CP3 may be C. The plurality of switches SPA1, SPA2, SPC1, SPC2, SPE1 and SPE2 switch the connection to one end side of the three capacitors CP1, CP2 and CP3 between the output and the reference potential of the integral unit 30 according to the clock signals P1 and P2. The plurality of switches SPB1, SPB2, SPD1, SPD2, SPF1 and SPF2 switch the connection to the other end side of the three capacitors CP1, CP2 and CP3 between the output and the reference potential of the predicting unit 60 according to the clock signals P1 and P2.

The predicting unit 60 may predict, based on the difference between the first integral signal AOUTB and the second integral signal AOUTB output at different timing by the integral unit 30, one of the first integral signal and the second integral signal output next to the output of the integral unit 30.

In the predicting unit 60, the switches SPA1, SPB1, SPC1, SPD1, SPE1, SPF1 are turned off, and the switches SPA2, SPB2, SPC2, SPD2, SPE2 and SPF2 are turned on during the operating period phi(2). In the predicting unit 60, the switches SPA1, SPB1, SPC1, SPD1, SPE1, SPF1 are turned on, and the switches SPA2, SPB2, SPC2, SPD2, SPE2 and SPF2 are turned off during the operating period phi(1).

During the operating period phi(2), the predictive circuit 61 samples the electric charges to the capacitor CP1 according to the output signal AOUTB of the integrator 10, and during the operating period phi(1), the predictive circuit 61 transfers, to the quantization unit 40, the sampled electric charges Q1 to the capacitor CP1. During the operating period phi(2), the predictive circuit 62 resets the electric charges of the capacitor CP2, and during the operating period phi(1), the predictive circuit 62 samples the electric charges to the capacitor CP2 according to the output signal AOUTB of the integrator 10, and transfers the sampled electric charges Q2 to the quantization unit 40. During the operating period phi(2), the predictive circuit 63 samples the electric charges to the capacitor CP3 according to the output signal AOUTB of the integrator 10, and during the operating period phi(1), the predictive circuit 63 inputs, to the polarized inversion circuit 65, the sampled electric charges to the capacitor CP3, and the polarized inversion circuit 65 transfers, to the quantization unit 40, the electric charges Q3 with the polarity of input electric charges inverted.

The predicting unit 60 may output, as the output signal AOUTB', the electric charges Q that has been obtained by synthesizing the electric charges Q1 sampled by the predictive circuit 61, the electric charges Q2 sampled by the predictive circuit 62 and electric charges Q3 sampled by the predictive circuit 63, to the quantization unit 40 during the operating period phi(1). Next, the relationship of the electric charges Q1, Q2 and Q3 are described.

Figure 5:
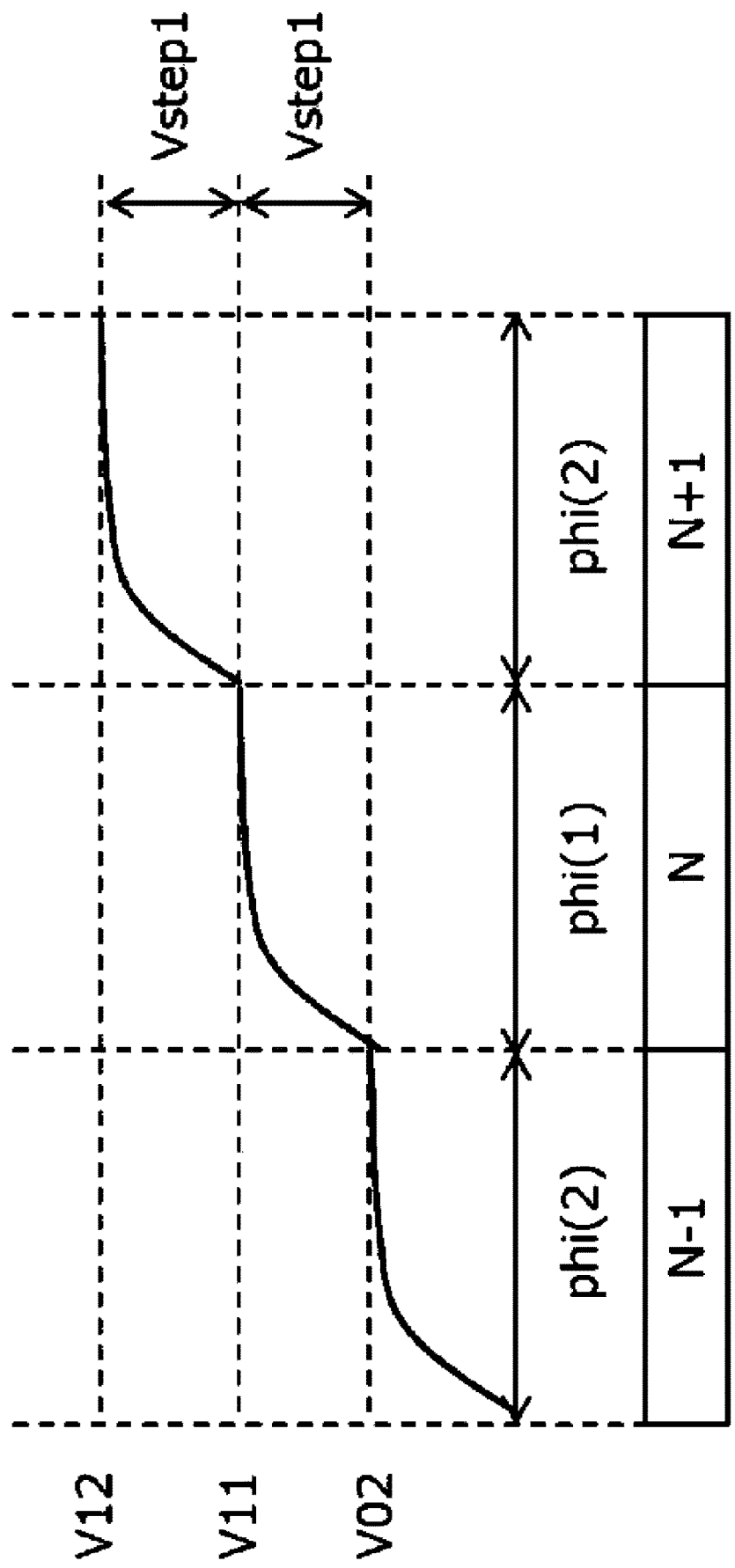
FIG. 5 illustrates a timing chart of an integral signal AOUTB of an integral unit 30.

FIG. 5 illustrates the timing chart of the integral signal AOUTB of the integral unit 30. In FIG. 5, the vertical axis indicates the voltage level of the integral signal AOUTB, and the horizontal axis indicates the time lapse.

V11 indicates the voltage level of the integral signal AOUTB of the integral unit 30 when the integration is completed during the current (Nth) operating period phi(1), V02 indicates the voltage level of the integral signal AOUTB of the integral unit 30 when the integration is completed during the previous ((N−1)th) operating period phi(2), and V12 indicates the voltage level of the integral signal AOUTB of the integral unit 30 when the integration is completed during the ((N+1)th) operating period phi(2). The Vstep 1, which is the difference between the previous voltage level and the current voltage level, is half of the changed amount of the voltage level of the integral signal AOUTB of the integral unit 30 when performing one integration during the current operating period phi(1) and the next operating period phi(2). Vstep 1 can be expressed by Expression (1), and C12 can be expressed by Expression (2).

[Expression (1)]

$$V\text{step }1 = V11 - V02 = V12 - V11 \qquad (1)$$

[Expression (2)]

$$V12 = V02 + (V11 - V02) + (V12 - V11) = V02 + 2 \times V\text{step }1 \qquad (2)$$

Herein, in accordance with the timing chart in FIG. 5, electric charges Q1 is expressed by Expression (3), electric charges Q2 is expressed by Expression (4), electric charges Q3 is expressed by Expression (5), electric charges Q that has been obtained by synthesizing the electric charges Q1, electric charges Q2 and electric charges Q3 is expressed by Expression (6), which are output to the quantization unit 40 during the current operating period phi(1).

[Expression (3)]

$$Q1 = -2C \times V02 \qquad (3)$$

[Expression (4)]

$$Q2 = 2C \times V11 \qquad (4)$$

[Expression (5)]

$$Q3 = C \times V02 \qquad (5)$$

[Expression (6)]

$$Q = Q1 + Q2 + Q3 = C \times V12 \qquad (6)$$

In this way, during the operating period phi(1), the predicting unit 60 generates the electric charges Q corresponding to the voltage level of the integral signal AOUTB of the integral unit 30 when the integration is completed during the next operating period phi(2), and outputs the electric charges Q as the predictive integral signal AOUTB' to the quantization unit 40. It should be noted that although the predicting unit 60 generates the predictive integral signal AOUTB' with the switched capacitor as illustrated in FIG. 4, it may also generate the predictive integral signal AOUTB' with the resistive division, amplifier or the like.

Figure 6:
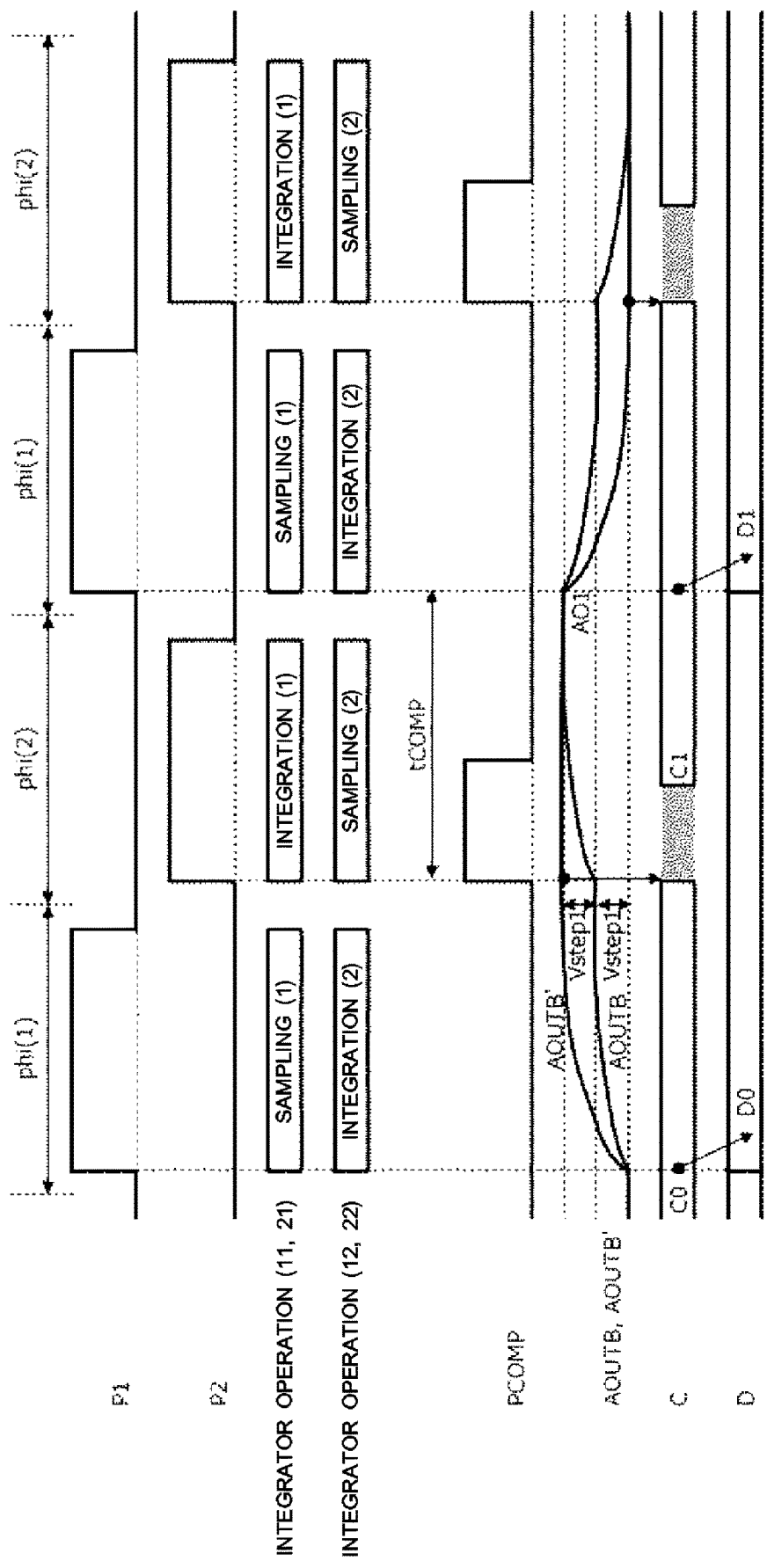
FIG. 6 illustrates one example of a timing chart of the AD converter 100 according to a first embodiment.

FIG. 6 illustrates one example of the timing chart of the AD converter 100 according to the first embodiment. In FIG. 6, the integrator operations (11, 21) indicate the operations of the first analog signal input circuit 11 and the first reference signal input circuit 21 in the integrator 10, and the integrator operations (12, 22) indicate the operations of the second analog signal input circuit 12 and the second reference signal input circuit 22 in the integrator 10. Herein, the integration of the operations of the integrator in FIG. 6 indicates the operations of integrating the output from the corresponding analog signal input circuit and the reference signal input circuit in the integral unit 30, and the same applies hereinafter in present specification. In FIG. 6, P1, P2 and PCOMP indicate the clock signals, C indicates the output of the comparator 41, and D indicates the digital signal output from the logic circuit 42. AOUTB and AOUTB' indicate the integral signal of the integrator 10 and the predictive integral signal of the predicting unit 60, respectively.

The AD converter 100 operates the operating period phi(1) and the operating period phi(2) as one cycle. The operating period phi(1) and the operating period phi(2) may have an identical length in the present embodiment, or may have different lengths.

The AD converter 100 divides the sampling operation into the sampling operation (1) and the sampling operation (2), and performs the sampling operation (1) and the sampling operation (2). Also, the AD converter 100 divides the integral operation into the integral operation (1) and the integral operation (2), and performs the sampling operation (1) and the sampling operation (2). During the operating period phi(1), the first analog signal input circuit 11 and the first reference signal input circuit 21 perform the sampling operation (1), which becomes the first sampling, according to the input of the clock signal P1. Next, during the operating period phi(2), the integral unit 30 performs the integral operation (1), which becomes the second integration, according to the input from the first analog signal input circuit 11 and the first reference signal input circuit 21. During the operating period phi(2), the second analog signal input circuit 12 and the second reference signal input circuit 22 perform the sampling operation (2), which becomes the second sampling, according to the input of the clock signal P2. Next, during the operating period phi(1), the integral unit 30 performs the integral operation (2), which becomes the first integration, according to the input of the second analog signal input circuit 12 and the second reference signal input circuit 22. In this way, the AD converter 100 performs the sampling operations and the integral operations during any of the operating period phi(1) and the operating period phi(2).

The AD converter 100 can relax the thronging requirement (that is, the output change speed requirement) of the integral unit 30 by dividing one integration into multiple times. In this way, the AD converter 100 can reduce the power consumption in the integral unit 30.

The integral signal AOUTB of the integral unit 30 rises with the integral operations of the integral unit 30 when the digital signal D is L, and falls with the integral operations of the integral unit 30 when the digital signal D is H. The integral signal AOUTB of the integral unit 30 becomes an integral end value AO1 when the integration of the integral unit 30 is completed. Also, the integral signal AOUTB of the integral unit 30 integrates to half the level of the integral end value AO1 in the integral operation (2), which becomes the first integration during the operating period phi(1), and becomes the integral end value AO1 with the integral operation (1) that becomes the second integration, during the operating period phi(2).

The digital signal D output from the logic circuit 42 is determined according to the quantization signal C at the rising time of the clock signal P1. The digital signal D0 is determined according to the quantization signal C0 at the rising time of the clock signal P1. The digital signal D1 is determined according to the quantization signal C1 at the rising time of the next clock signal P1. In this way, the AD converter 100 operates with the configured polarity from the rising time of the clock signal P1 to the rising time of the next clock signal P1.

The predicting unit 60 generates, during the operating period phi(1), the predictive integral signal AOUTB' that has predicted the integral end value AO1 during the operating period phi(2). The control unit 50 causes the quantization unit 40 to perform the quantization of the predictive integral signal AOUTB' output by the predicting unit 60. The quantization unit 40 outputs the quantization signal C that has quantized the predictive integral signal AOUTB' input at the rising time of the clock signal PCOMP. The logic circuit 42 outputs the digital signal D input at the rising edge of the next clock signal P1 and holds the output of the same digital signal to the rising edge of the clock signal P1.

The period tCOMP is a period from the rising time of the clock signal PCOMP to the rising time of the clock signal P1, and indicates the period from the starting timing of the quantization operation to the timing to confirm the output digital signal D. In the quantization unit 40, the power consumption changes according to the length of the period tCOMP, and for example, when the period tCOMP becomes longer, the power consumption in the quantization unit 40 is reduced, since the speed requirement to the quantization unit 40 is relaxed.

In the AD converter 100 in the present embodiment, since the quantization unit 40 quantizes the predictive integral signal AOUTB' output by the predicting unit 60, which has predicted the integral end value AO1, the AD converter 100 can realize a high S/N ratio with virtually no error with respect to the actual integral end value AO1. Also, for the predictive integral signal AOUTB' output by the predicting unit 60, since the AD converter 100 starts the quantization at the rising time of the clock signal PCOMP, the period tCOMP can be longer, and the power consumption of the quantization unit 40 can be reduced.

FIG. 7 illustrates (a) the block of the first order moving average filter and (b) the frequency characteristics. Regarding the operating period phi(2) of performing the second integration as the current, the AD converter 100 of the present embodiment divides one integration and performs the integrations twice, the first integration during the period immediately before the current (the operating period phi(1)) and the second integration during the current period (the operating period phi(2)), and outputs the sum of the first integral result and the second integral result as the integral result AOUTB. In this way, the transfer function H(z) is expressed by the Expression (7), wherein the analog input signal Ain or the reference input signal Sref is regarded as the input, and the integral result AOUTB is regarded as the output, with the transfer characteristic of the moving average filter using the z function.

[Expression (7)]

$$H(z) = \tfrac{1}{2} \times (1 + z^{-1}) \qquad (7)$$

In the AD converter 100 of the present embodiment, since the transfer function H(z) with the reference input signal Sref as the input, the integral result AOUTB as the output, has transfer characteristics of the moving average filter as expressed in Expression (7), it is difficult to generate noise in the target low-frequency signal domain of the AD conversion due to the effect of the high-frequency noise such as external digital signals.

Figure 8:
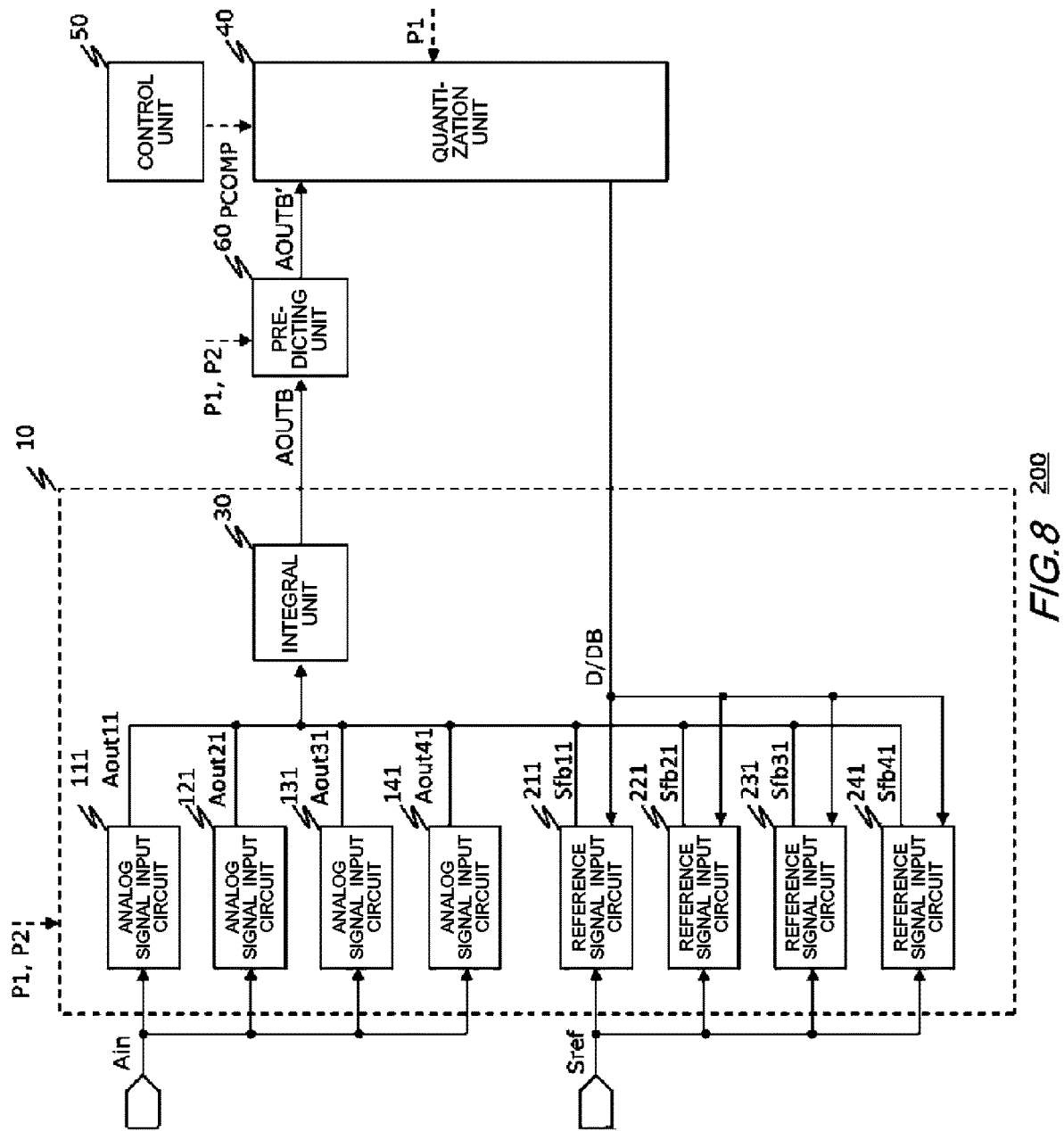
FIG. 8 illustrates an overview of a configuration of an AD converter 200 in a second embodiment.

FIG. 8 illustrates an overview of a configuration of the AD converter 200 in the second embodiment. The AD converter 200 of the second embodiment has a configuration and a function similar to that of the AD converter 100 in the first embodiment, however, the integrator 10 has four analog signal input circuits 111 to 141 and four reference signal input circuits 211 to 241. The AD converter 200 in the second embodiment divides one integration into four integrations, predicts the fourth integral result of the performed fourth integration at the timing when the second integral result of the second integration performed by the integrator 10 is output, and quantizes the predictive integral signal AOUTB'. Hereinafter, the descriptions of the configurations and functions that are similar to the AD converter 100 in the first embodiment may be omitted, and the configurations and functions that are different from the AD converter 100 in the first embodiment are mainly described.

Four analog signal input circuits 111 to 141 may respectively have the configurations and functions similar to the first analog signal input circuit 11 or the second analog signal input circuit 12 of the AD converter 100 in the first embodiment. The four analog signal input circuits 111 to 141 may perform the sampling and output the analog output signal during periods that are different from each other. Four reference signal input circuits 211 to 241 may respectively have configurations and functions similar to the first reference signal input circuit 21 or the second reference signal input circuit 22 of the AD converter 100 in the first embodiment.

Figure 9:
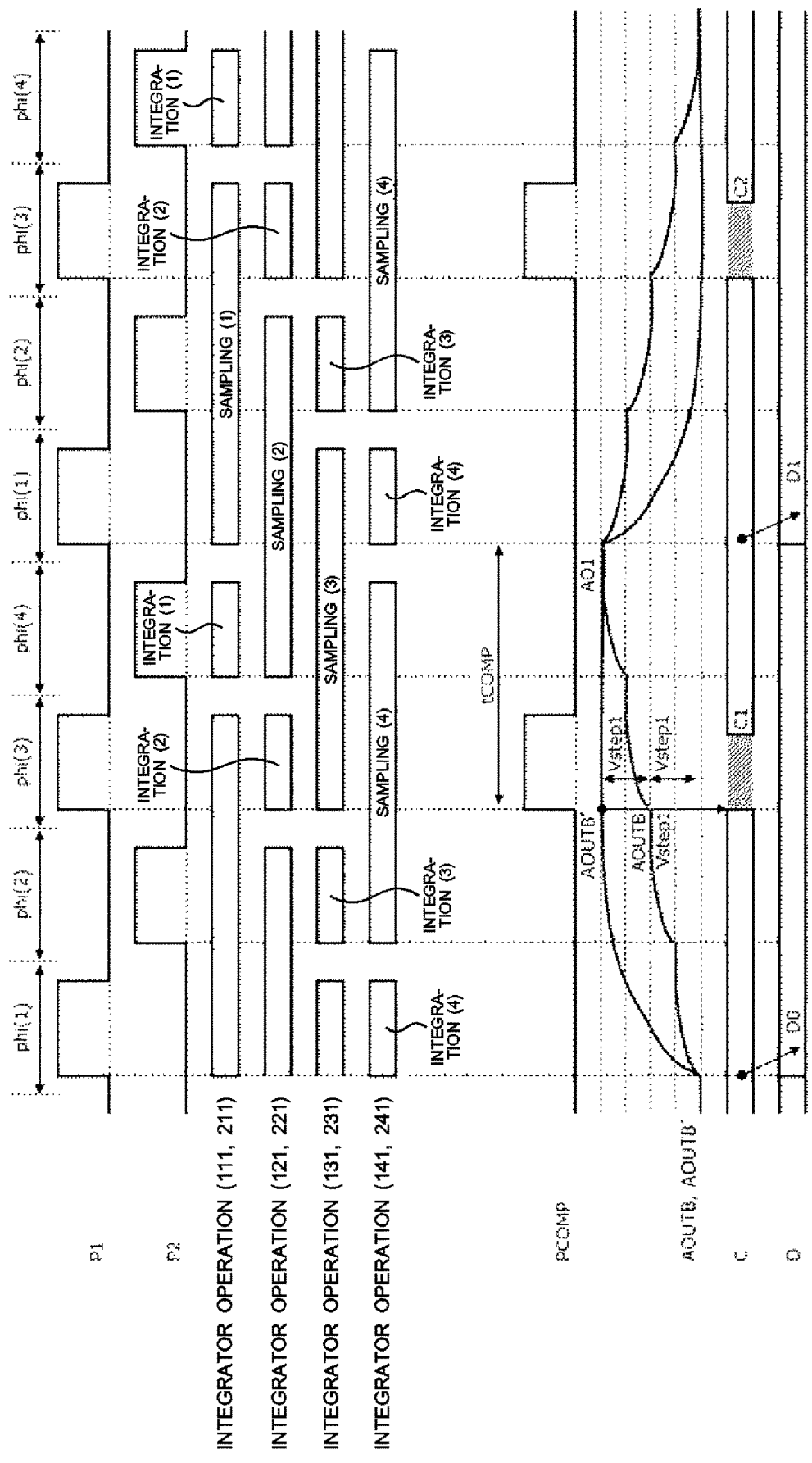
FIG. 9 illustrates one example of a timing chart of the AD converter 200 in the second embodiment.

FIG. 9 illustrates one example of the timing chart of the AD converter 200 in the second embodiment. Herein, in FIG. 9, the integrator operations (111, 211) indicate the operations of the first analog signal input circuit 111 and the first reference signal input circuit 211 in the integrator 10, and the integrator operations (121, 221) indicate the operations of the second analog signal input circuit 121 and the second reference signal input circuit 221 in the integrator 10. The integrator operations (131, 231) indicate the operations of the third analog signal input circuit 131 and the third reference signal input circuit 231 in the integrator 10, and the integrator operations (141, 241) indicate the operations of the fourth analog signal input circuit 141 and the fourth reference signal input circuit 241 in the integrator 10. In FIG. 9, P1, P2 and PCOMP indicate the clock signals, C indicates the output of the comparator 41, and D indicates the digital signal output from the logic circuit 42. AOUTB and AOUTB' indicate the integral signal of the integrator 10 and the predictive integral signal of the predicting unit 60, respectively.

The AD converter 200 operates to repeat the operating period phi(1), the operating period phi(2), the operating period phi(3) and the operating period phi(4) defined by the clock signals P1 and P2 alternately in a time-divisional manner. The AD converter 200 operates the operating period phi(1), the operating period phi(2), the operating period phi(3) and the operating period phi(4) as one cycle. The operating period phi(1), the operating period phi(2), the operating period phi(3) and the operating period phi(4) may be with an identical length to each other, or may be with different lengths. The AD converter 200 divides the sampling operation into the sampling operation (1), the sampling operation (2), the sampling operation (3) and the sampling operation (4) and performs them. The AD converter 200 divides the integral operation into the integral operation (1), the integral operation (2), the integral operation (3) and the integral operation (4) and performs them.

The predicting unit 60 may have configurations and functions similar to the predicting unit 60 of the AD converter 100 in the first embodiment. The predicting unit 60 may predict the integral result at the ending timing of one cycle based on the integral result in the middle of one cycle during the integral operation of one cycle. The predicting unit 60 may generate a predictive integral signal AOUTB' of predicting the integral end value AO1 during the future operating period phi(4) during the operating period phi(2), as one example.

Figure 10:
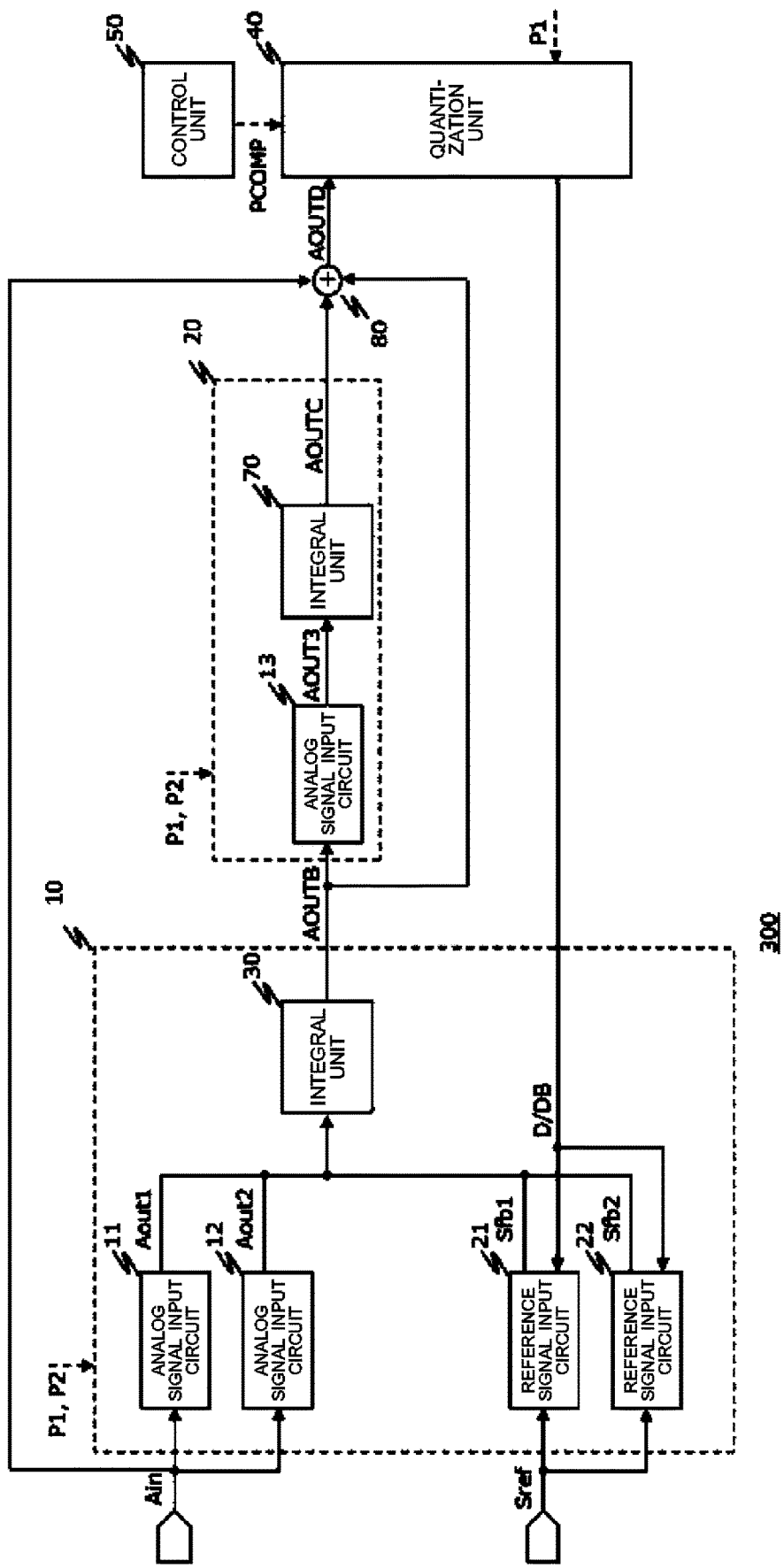
FIG. 10 illustrates an overview of a configuration of an AD converter 300 in a third embodiment.

FIG. 10 illustrates an overview of the configuration of the AD converter 300 in the third embodiment. The AD converter in the third embodiment has configurations and functions similar to the AD converter 100 in the first embodiment, however, includes a second integrator 20 and a predictive addition unit 80 (an adding circuit of the present application). The AD converter 300 is, for example, an AD converter with a second-order delta-sigma modulator, and can realize a higher S/N ratio by moving the quantization noise to a higher frequency side than the AD converter 100 in the first embodiment. The second integrator 20 and the predictive addition unit 80 are input with clock signals P1 and P2. Hereinafter, the descriptions of the configurations and functions that are similar to the AD converter 100 in the first embodiment may be omitted, and the configurations and functions that are different from the AD converter 100 in the first embodiment are mainly described.

The second integrator 20 has a third analog signal input circuit 13 and a second integral unit 70 (the second integral circuit of the present application). The third analog signal input circuit 13 is connected between the output of the integrator 10 and the second integral unit 70. The third analog signal input circuit 13 is input with the first integral signal AOUTB and the second integral signal AOUTB at different timing from the second integral unit 70, and outputs the third analog output signal AOUT 3 based on the first integral signal AOUTB or the second integral signal AOUTB. The third analog signal input circuit 13 outputs the third analog output signal AOUT 3 based on the integral signal AOUTB output from the first integral unit 30 during the last of a period that has been divided into X periods, that is, the Xth period. The third analog signal input circuit 13 may sample the integral signal AOUTB during the operating period phi(1), and output the analog output signal AOUT 3 during the operating period phi(2).

The second integral unit 70 is connected to the predictive addition unit 80, and outputs the integral signal AOUTC by integrating the analog output signal AOUT 3 from the third analog signal input circuit 13. The second integral unit 70 is input with the clock signals P1 and P2, and integrates the analog output signal AOUT 3 during the operating period phi(2), and outputs the integral signal AOUTC to the predictive addition unit 80.

The predictive addition unit 80 is connected to the input terminal input with the analog input signal Ain, the output of the first integral unit 30 and the output of the second integral unit 70. The predictive addition unit 80 adds the analog input signal Ain and the second integral signal AOUTC to the predictive integral signal AOUTB', and outputs the adding result AOUTD to the quantization unit 40. Next, more details about the AD converter 300 in the third embodiment is described below.

Figure 11:
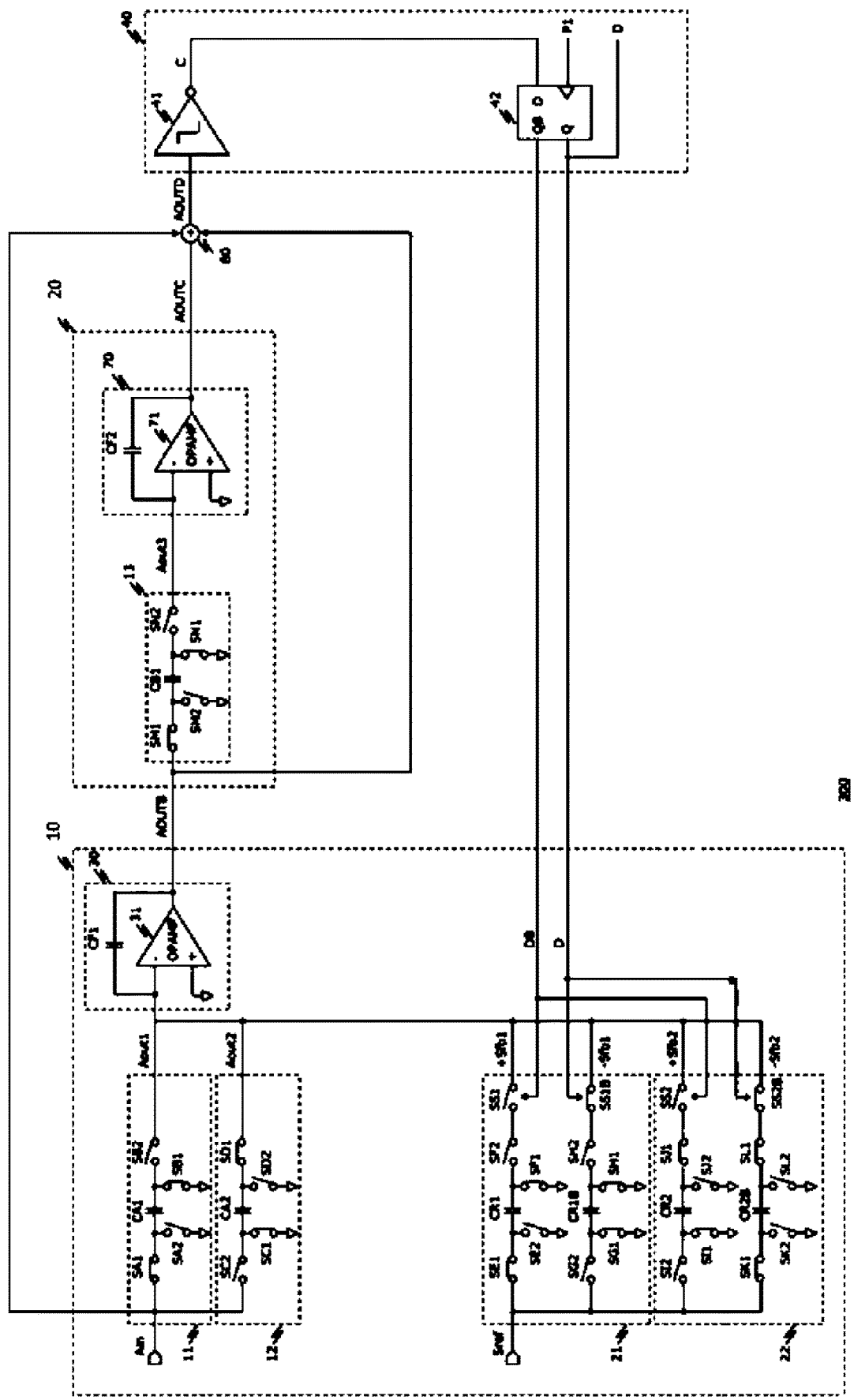
FIG. 11 illustrates a more detailed configuration of the AD converter 300 in the third embodiment.

FIG. 11 illustrates a more detailed configuration of the AD converter 300 in the third embodiment. The third analog signal input circuit 13 has a capacitor CB1, a plurality of switches SM1 and SM2 that switch the connection to one end side of the capacitor CB1 between the output of the integral unit 30 and the reference potential, and a plurality of switches SN1 and SN2 that switch the connection to the other end side of the capacitor CB1 between the output of the third analog signal input circuit 13 and the reference potential.

The switches SM1 and SN1 are turned on when the clock signal P1 is H, and turned off when the clock signal P2 is H. Also, the switches SM2 and SN2 are turned on when the clock signal P2 is H, and turned off when the clock signal P1 is H. The third analog signal input circuit 13 accumulates the electric charges according to the integral signal AOUTB of the integral unit 30 in the capacitor CB1 during the operating period phi(1), and during the next operating period phi(2), transfers the accumulated electric charges to the second integral unit 70. In this way, the analog signal input circuit 13 may perform the sampling operation during the operating period phi(1), and perform the integral operation during the operating period phi(2).

The second integral unit 70 has an operational amplifier 71 and a capacitor CF 2. In the operational amplifier 71, the inverting input terminal is connected to the output of the third analog signal input circuit 13, the non-inverting input terminal is connected to the reference potential, and the output terminal is connected to the predictive addition unit 80. The capacitor CF 2 is provided between the inverting input terminal and the output terminal of the operational amplifier 71. The second integral unit 70 may perform integration of the analog output signal Aout 3 during the operating period phi(2). It should be noted that in the operational amplifier 71 in the present embodiment, the non-inverting input terminal is a single-end input and a single-end output connected to the ground, but may also be a differential input and a differential output.

Figure 12:
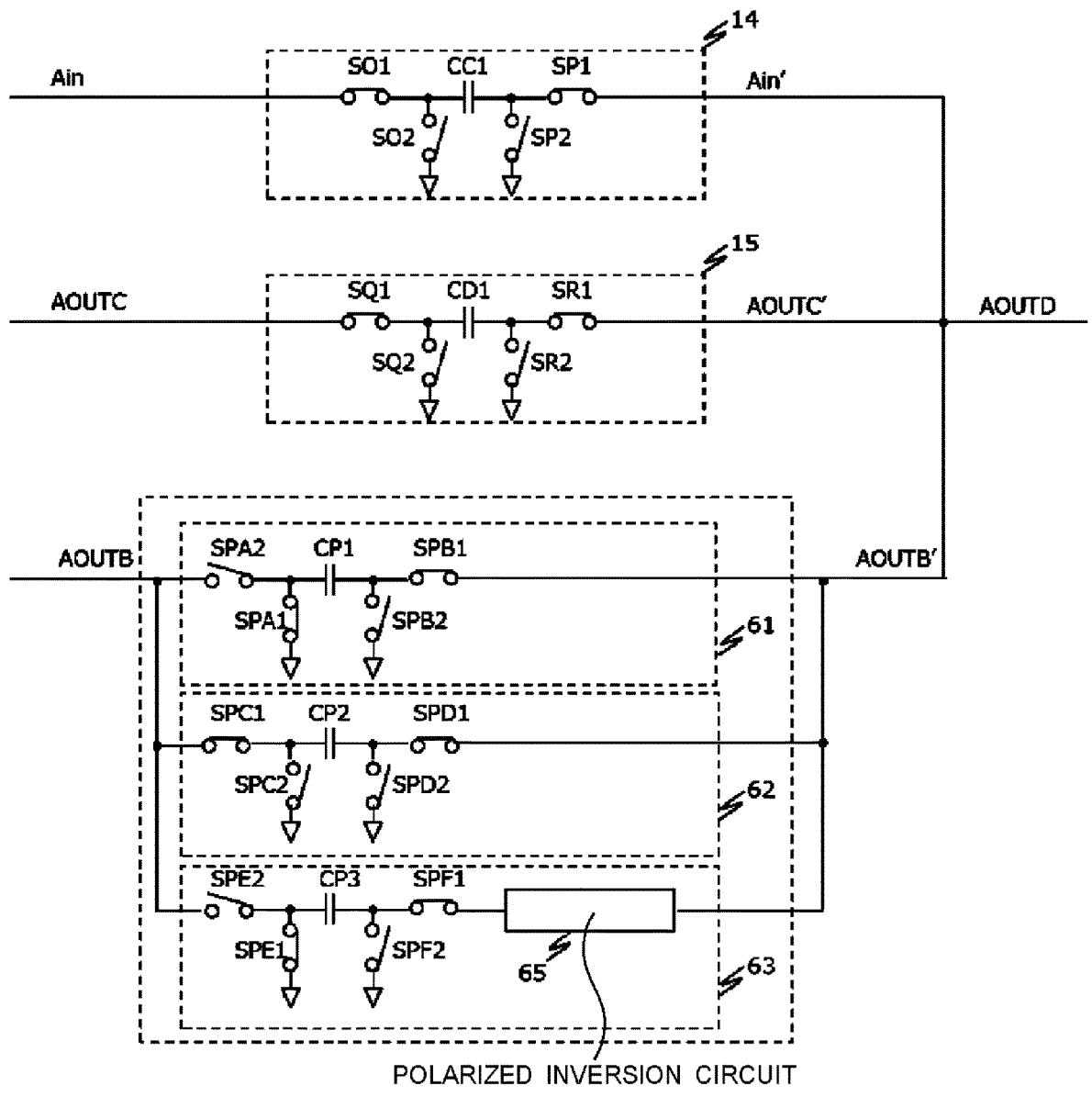
FIG. 12 illustrates a configuration of a predictive addition unit.

FIG. 12 illustrates a configuration of the predictive addition unit 80. The predictive addition unit 80 has an analog signal input circuit 14, an analog signal input circuit 15 and a predicting unit 60. The predicting unit 60 may have configurations and functions similar to the predicting unit 60 of the AD converter 100 in the first embodiment.

The analog signal input circuit 14 is connected to the input terminal of the AD converter 300 and input with the analog input signal Ain. The analog signal input circuit 14 outputs the analog output signal Ain' according to the input analog input signal Ain. The analog signal input circuit 14 has a capacitor CC1, a plurality of switches SO1 and SO2 that switch the connection to one end side of the capacitor CC1 between the input terminal and the reference potential, and a plurality of switches SP1 and SP2 that switch the connection to the other end side of the capacitor CC1 between the output of the analog signal input circuit 14 and the reference potential. The switches SO1 and SP1 are turned on when the clock signal P1 is H, and turned off when the clock signal P2 is H. The switches SO2 and SP2 are turned on when the clock signal P2 is H, and turned off when the clock signal P1 is H. In this way, during the operating period phi(1), the capacitor CC1 outputs the electric charges as the analog output signal Ain' according to the analog input signal Ain. During the next operating period phi(2), the capacitor CC1 resets the accumulated electric charges. In other words, the capacitor CC1 samples the zero signal intended to be zero V as the electric charges.

The analog signal input circuit 15 is connected to the output of the second integrator 20, and input with the integral signal AOUTC. The analog signal input circuit 15 outputs the analog output signal AOUTC' according to the integral signal AOUTC. The analog signal input circuit 15 has a capacitor CD1, a plurality of switches SQ1 and SQ2 that switch the connection to one end side of the capacitor CD1 between the output of the second integrator 20 and the reference potential, and a plurality of switches SR1 and SR2 that switch the connection to the other end side of the capacitor CD1 between the output of the analog signal input circuit 15 and the reference potential. The switches SQ1 and SR1 are turned on when the clock signal P1 is H, and turned off when the clock signal P2 is H. The switches SQ2 and SR2 are turned on when the clock signal P2 is H, and turned off when the clock signal P1 is H. In this way, during the operating period phi(1), the capacitor CD1 outputs the electric charges as the output signal AOUTC' according to the integral signal AOUTC from the second integral unit 70. Also, during the next operating period phi(2), the capacitor CD1 resets the accumulated electric charges. In other words, the capacitor CD1 samples the zero signal intended to be zero V as the electric charges.

During the operating period phi(1), the predicting unit 60 generates the electric charges Q corresponding to the voltage level of the integral signal AOUTB of the operational amplifier 31 when the integration is completed during the next operating period phi(2), and outputs the electric charges Q as the predictive integral signal AOUTB'. The adding result AOUTD can be realized by connecting the analog output signal Ain' from the analog signal input circuit 14, the analog output signal AOUTC' from the analog signal input circuit 15, and the predictive integral signal AOUTB' from the predicting unit 60.

During the operating period phi(1), the predictive addition unit 80 may add the analog output signal Ain' of the analog signal input circuit 14, the analog output signal AOUTC' of the analog signal input circuit 15 and the predictive integral signal AOUTB' of the predicting unit 60, and output the adding result AOUTD to the quantization unit 40. The comparator 41 quantizes the adding result AOUTD input at the rising time of the clock signal PCOMP and generates the quantization signal C.

Figure 13:
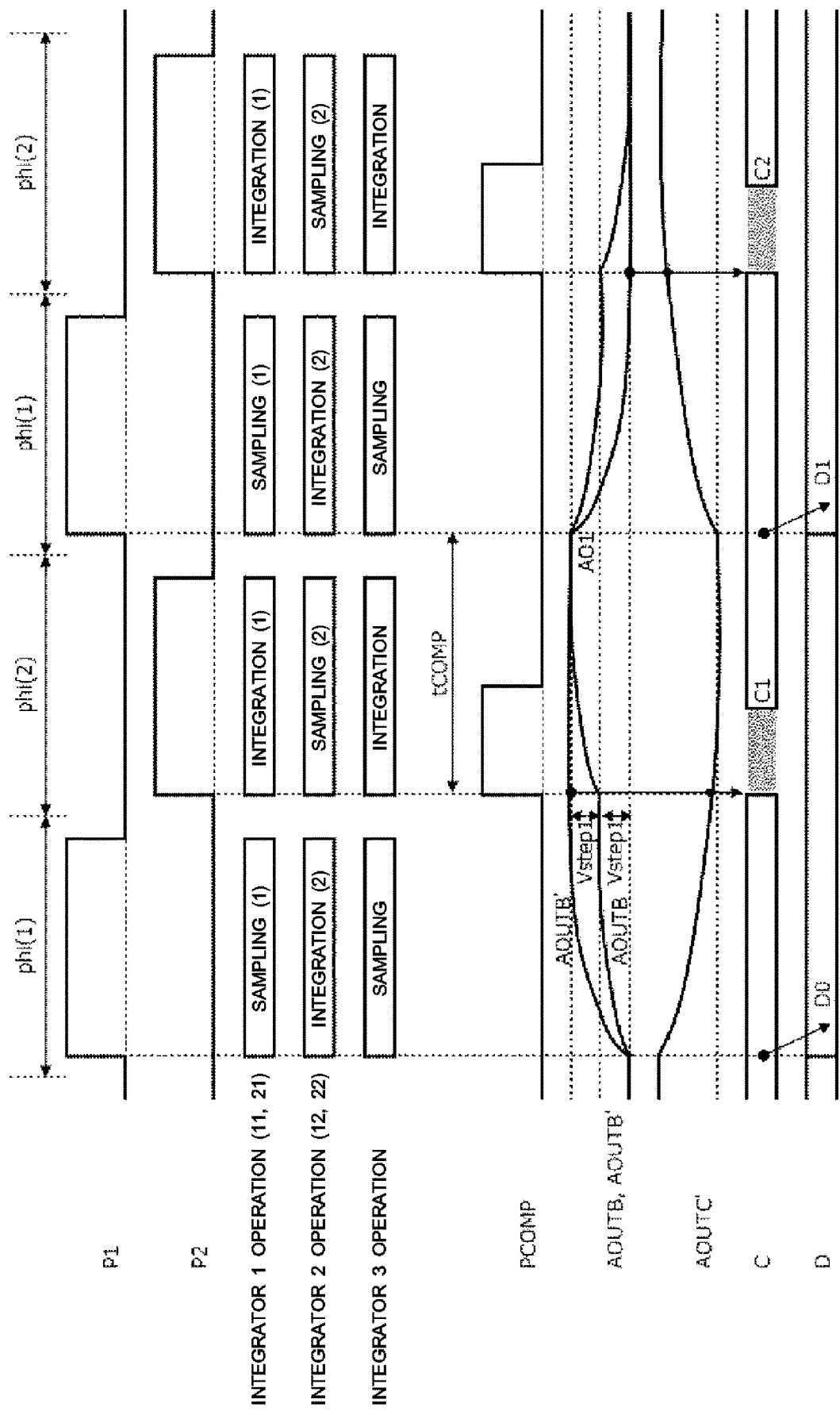
FIG. 13 illustrates one example of a timing chart of the AD converter 300 in the third embodiment.

FIG. 13 illustrates one example of the timing chart of the AD converter 300 according to the third embodiment. In FIG. 13, the operations of the integrator 1 (11, 21) indicates the operations of the first analog signal input circuit 11 and the first reference signal input circuit 21 in the integrator 10, and the operations of the integrator 1 (12, 22) indicates the operations of the second analog signal input circuit 12 and the second reference signal input circuit 22 in the integrator 10. In FIG. 13, the operations of the integrator 2 indicates the operations of the second integrator 20. P1, P2 and PCOMP indicate the clock signals, C indicates the output of the comparator 41, and D indicates the digital signal output from the logic circuit 42. AOUTB and AOUTB' indicate respectively the integral signal of the integrator 10 and the predictive integral signal of the predicting unit 60, and AOUTC' indicates the analog output signal of the analog signal input circuit 15.

The AD converter 300 operates to repeat the operating period phi(1) and the operating period phi(2) alternately in a time-divisional manner, and operates the operating period phi(1) and the operating period phi(2) as one cycle. The operating period phi(1) and the operating period phi(2) may have an identical length in the present embodiment, or may have different lengths.

The AD converter 300 divides the sampling operation into the sampling operation (1) and the sampling operation (2), and divides the integral operation into the integral operation (1) and the integral operation (2) and performs them. The predictive addition unit 80 adds the analog output signal Ain' of the analog signal input circuit 14, the analog output signal AOUTC' of the analog signal input circuit 15 during the operating period phi(1) and the predictive integral signal AOUTB' of the predicting unit 60 of predicting the integral end value AO1 during the operating period phi(2), and generates the adding result AOUTD. The control unit 50 causes the quantization unit 40 to perform the quantization on the adding result AOUTD of the predictive addition unit 80. The quantization unit 40 outputs the quantization signal C that has quantized the adding result AOUTD input at the rising time of the clock signal PCOMP. The logic circuit 42 outputs the digital signal D input at the rising edge of the clock signal P1 and holds the same output signal to the rising edge of the next clock signal P1.

Figure 14:
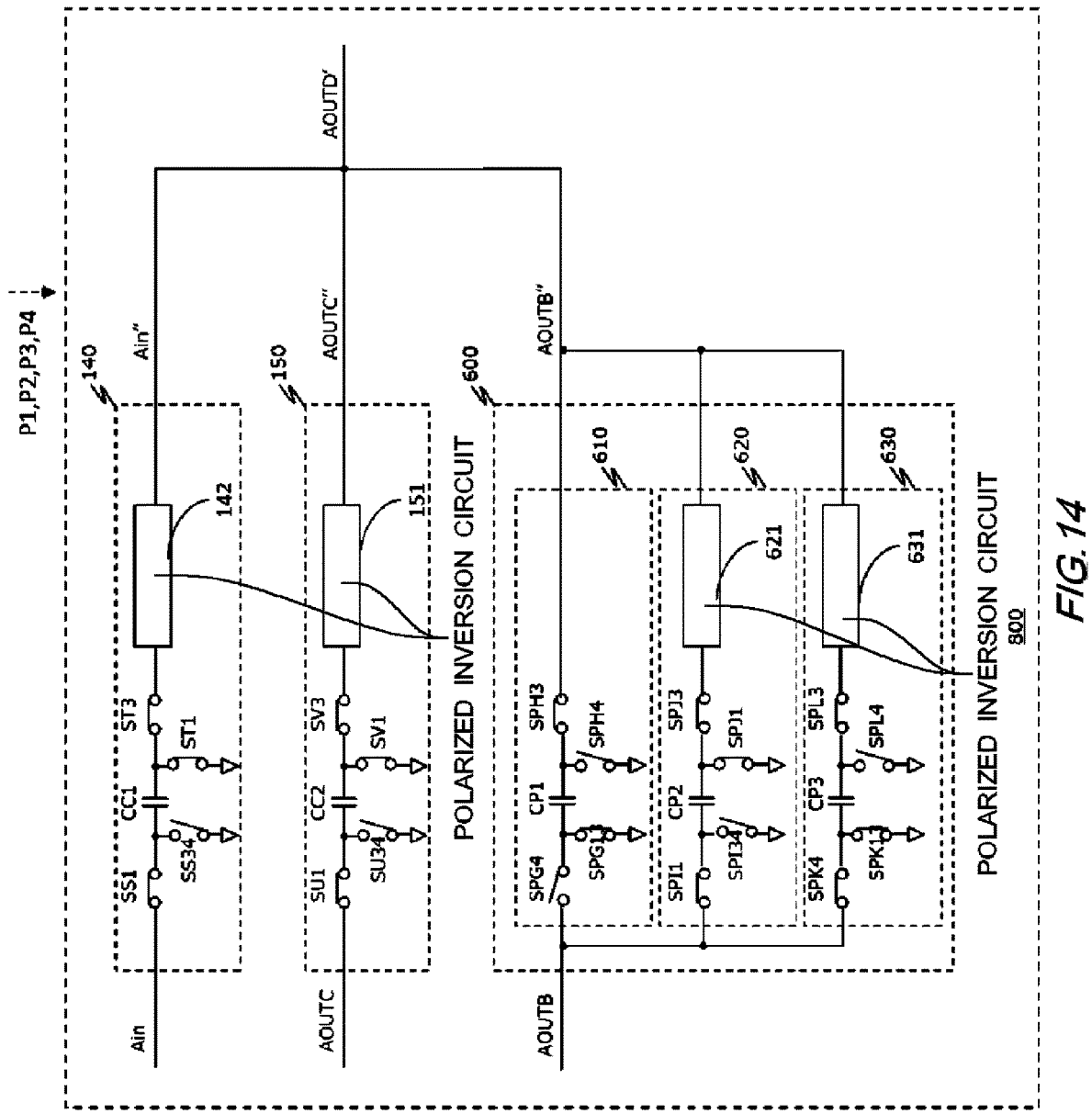
FIG. 14 illustrates a variant example of the predictive addition unit.

FIG. 14 illustrates a configuration of the predictive addition unit 800 in a variant example. The predictive addition unit 800 in the variant example is connected to the input terminal input with the analog input signal Ain, the output of the first integral unit 30 and the output of the second integral unit 70. The predictive addition unit 800 may be input with the analog input signal Ain, the integral signal AOUTB and the integral signal AOUTC, and output the integral signal AOUTD' adding the analog input signal Ain and the integral signal AOUTC to the predicted predictive integral signal AOUTB" to the quantization unit 40. The predictive addition unit 800 has an analog signal input circuit 140, an analog signal input circuit 150 and a predicting unit 600.

The analog signal input circuit 140 is connected to the input terminal of the AD converter 300, and input with the analog input signal Ain, and outputs the analog input signal Ain". The analog signal input circuit 140 has a capacitor CC1, a plurality of switches SS1 and SS34 that switch the connection to one end side of the capacitor CC1 between the input terminal and the reference potential, a plurality of switches ST1 and ST3 that switch the connection to the other end side of the capacitor CC1 between the output and the reference potential of the analog signal input circuit 140, and a polarized inversion circuit 142 connected to the output of the analog signal input circuit 140. The polarized inversion circuit 142 may output the signal inverting the polarity of the input electric charges, and may be configured by an inverting amplifier.

The analog signal input circuit 150 is connected to the output of the second integrator 20, and input with the integral signal AOUTC, and outputs the analog output signal AOUTC". The analog signal input circuit 150 has a capacitor CC2, a plurality of switches SU1 and SU34 that switch the connection to one end side of the capacitor CC2 between the output of the second integrator 20 and the reference potential, a plurality of switches SV1 and SV3 that switch the connection to the other end side of the capacitor CC2 between the output and the reference potential of the analog signal input circuit 150, and a polarized inversion circuit 151. The polarized inversion circuit 151 may output the signal inverting the polarity of the input electric charges, and may be configured by an inverting amplifier.

The predicting unit 600 is connected to the output of the integrator 10, input with the integral signal AOUTB, and outputs the predictive integral signal AOUTB". The predicting unit 600 has three capacitors CP1, CP2 and CP3, a plurality of switches SPG4, SPG13, SPH3, SPH4, SPI1, SPI34, SPJ1, SPJ3, SPK4, SPK13, SPL3 and SPL4, and polarized inversion circuits 621 and 631, which are connected in parallel between the input and the output of the predicting unit 600, and constitutes three predictive circuits 610, 620 and 630.

The predictive circuit 610 has a capacitor CP1 and switches SPG4, SPG13, SPH3 and SPH4. The capacity value of the capacitor CP1 is 2C as one example. The switches SPG13 and SPG4 switch the connection to one end side of the capacitor CP1 between the output and the reference potential of the integrator 10. The switches SPH3 and SPH4 switch the connection to the other end side of the capacitor CP1 between the output and the reference potential of the predictive circuit 610.

The predictive circuit 620 has a capacitor CP2 and switches SPI1, SPI34, SPJ1 and SPJ3, and a polarized inversion circuit 621 connected to the output of the predictive circuit 620. The capacity value of the capacitor CP2 is 2C as one example. The switches SPI1 and SPI34 switch the connection to one end side of the capacitor CP2 between the output and the reference potential of the integrator 10. The switches SPJ1 and SPJ3 switch the connecting to the other end side of the capacitor CP2 between the input and the reference potential of the polarized inversion circuit 621. The polarized inversion circuit 621 may output the signal inverting the polarity of the input electric charges, and may be configured by the inverting amplifier.

The predictive circuit 630 has a capacitor CP3, and switches SPK4, SPK13, SPL3 and SPL4, and a polarized inversion circuit 631 connected to the output of the predictive circuit 630. The capacity value of the capacitor CP3 is C as one example. The switches SPK4 and SPK13 switch the connection to one end side of the capacitor CP3 between the output and the reference potential of the integrator 10. The switches SPL3 and SPL4 switch the connecting to the other end side of the capacitor CP3 between the input and the reference potential of the polarized inversion circuit 631. The polarized inversion circuit 631 may output the signal inverting the polarity of the input electric charges, and may be configured by an inverting amplifier.

Figure 15:
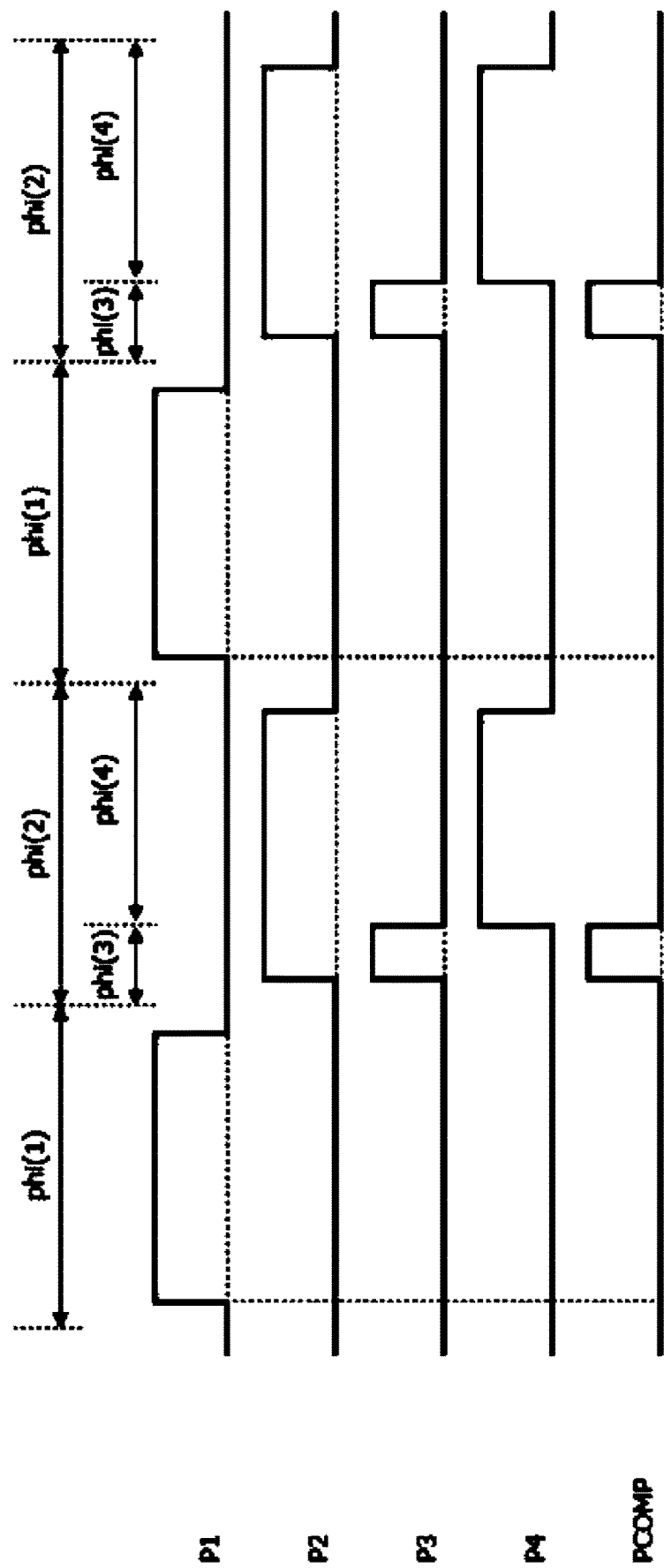
FIG. 15 illustrates a clock signal P1, a clock signal P2, a clock signal P3, a clock signal P4 and a clock signal PCOMP.

FIG. 15 illustrates the clock signal P1, the clock signal P2, the clock signal P3, the clock signal P4 and the clock signal PCOMP that cause the AD converter 300 to operate according to the third embodiment including the predictive addition unit 800. The clock signal P1 becomes H during the operating period phi(1), and becomes L during other periods. The clock signal P2 becomes H during the operating period phi(2), and becomes L during other periods. The clock signal P3 and the clock signal PCOMP become H during the operating period phi(3), and becomes L during other periods. The clock signal P4 becomes H during the operating period phi(4), and becomes L during other periods. The clock signal P3 becomes H during the first half period of the operating period phi(2), and the clock signal P4 becomes H during the second half period of the operating period phi(2). The clock signal P3 and the clock signal PCOMP are clock signals operating at the same rising time and falling timing.

In the analog signal input circuit 140, the switch SS1 is turned on when the clock signal P1 is H, and turned off when the clock signal P3 is H and the clock signal P4 is H. The switch SS34 is turned on when the clock signal P3 is H and the clock signal P4 is H, and turned off when the clock signal P1 is H. The switch ST1 is turned on when the clock signal P1 is H, and turned off when the clock signal P3 is H and the clock signal P4 is H. The switch ST3 is turned on when the clock signal P3 is H, and turned off when the clock signal P1 is H and the clock signal P4 is H.

The analog signal input circuit 140 samples the electric charges to the capacitor CC1 according to the analog input signal Ain during the operating period phi(1), and transfers the sampled electric charges to the capacitor CC1 during the operating period phi(3), and transfers the electric charges with polarity inverted by the polarized inversion circuit 142 as the output signal Ain" to the quantization unit 40. Although the analog signal input circuit 140 is with a single-ended configuration in the present embodiment, when it is with a differential configuration, the analog signal input circuit 140 may also sample the electric charges according to the signal with a polarity opposite to the analog input signal Ain.

In the analog signal input circuit 150, the switch SU1 is turned on when the clock signal P1 is H, and turned off when the clock signal P3 is H and the clock signal P4 is H. The switch SU34 is turned on when the clock signal P3 is H and the clock signal P4 is H, and turned off when the clock signal P1 is H. The switch SV1 is turned on when the clock signal P1 is H, and turned off when the clock signal P3 is H and the clock signal P4 is H. The switch SV3 is turned on when the clock signal P3 is H, and turned off when the clock signal P1 is H and the clock signal P4 is H.

The analog signal input circuit 150 samples the electric charges to the capacitor CC2 according to the output signal AOUTC of the operational amplifier 71 during the operating period phi(1), and transfers, to the polarized inversion circuit 151 during the operating period phi(3), the sampled electric charges to the capacitor CC2, and transfers the electric charges with the polarity inverted by the polarized inversion circuit 151 as the output signal AOUTC" to the quantization unit 40. Although the analog signal input circuit 150 is with a single-ended configuration in the present embodiment, when it is with a differential configuration, the analog signal input circuit 150 may also sample the electric charges according to the signal with a polarity opposite to the output signal AOUTC of the operational amplifier 71.

In the predictive circuit 610, the switch SPG13 is turned on when the clock signal P1 is H and the clock signal P3 is H, and turned off when the clock signal P4 is H. The switch SPG4 is turned on when the clock signal P4 is H, and turned off when the clock signal P1 is H and the clock signal P3 is H. The switch SPH3 is turned on when the clock signal P3 is H, and turned off when the clock signal P1 is H and the clock signal P4 is H. The switch SPH4 is turned on when the clock signal P4 is H, and turned off when the clock signal P1 is H and the clock signal P3 is H.

The predictive circuit 610 samples the electric charges to the capacitor CP1 according to the output signal AOUTB of the operational amplifier 31 during the operating period phi(4), and transfers the sampled electric charges Q1 to the capacitor CP1 during the operating period phi(3).

In the predictive circuit 620, the switch SPI1 is turned on when the clock signal P1 is H, and turned off when the clock signal P3 is H and the clock signal P4 is H. The switch SPI34 is turned on when the clock signal P3 is H and the clock signal P4 is H, and turned off when the clock signal P1 is H. The switch SPJ1 is turned on when the clock signal P1 is H, and turned off when the clock signal P3 is H and the clock signal P4 is H. The switch SPJ3 is turned on when the clock signal P3 is H, and turned off when the clock signal P1 is H and the clock signal P4 is H.

The predictive circuit 620 samples the electric charges to the capacitor CP2 according to the output signal AOUTB of the operational amplifier 31 during the operating period phi(1), and transfers the sampled electric charges to the capacitor CP2 and the electric charges Q2 with the polarity inverted by the polarized inversion circuit 621 during the operating period phi(3). Although the predictive circuit 620 is with a single-ended configuration in the present embodiment, when it is with a differential configuration, the predictive circuit 620 may also sample the electric charges according to the signal with a polarity opposite to the output signal AOUTB of the operational amplifier 31.

In the predictive circuit 630, the switch SPK13 is turned on when the clock signal P1 is H and the clock signal P3 is H, and turned off when the clock signal P4 is H. The switch SPK4 is turned on when the clock signal P4 is H, and turned off when the clock signal P1 is H and the clock signal P3 is H. The switch SPL3 is turned on when the clock signal P3 is H, and turned off when the clock signal P1 is H and the clock signal P4 is H. The switch SPL4 is turned on when the clock signal P4 is H, and turned off when the clock signal P1 is H and the clock signal P3 is H.

The predictive circuit 630 samples the electric charges to the capacitor CP3 according to the output signal AOUTB of the operational amplifier 31 during the operating period phi(4), and transfers the sampled electric charges to the capacitor CP3 and the electric charges Q3 with the polarity inverted by the polarized inversion circuit 631 during the operating period phi(3). Although the predictive circuit 630 is with a single-ended configuration in the present embodiment, when it is with a differential configuration, the predictive circuit 630 may also sample the electric charges according to the signal with a polarity opposite to the output signal AOUTB of the operational amplifier 31.

The predicting unit 600 outputs, as the output signal AOUTB", the electric charges Q that has been obtained by synthesizing the electric charges Q1 sampled by the predictive circuit 610, the electric charges Q2 sampled by the predictive circuit 620 and electric charges Q3 sampled by the predictive circuit 630, to the quantization unit 40 during the operating period phi(3). During the operating period phi(3), the predicting unit 600 generates the electric charges Q corresponding to the voltage level of the output signal AOUTB' of the operational amplifier 31 when the integration is completed during the next operating period phi(2), and outputs the electric charges Q as the predictive integral signal AOUTB". The adding result AOUTD' can be realized by connecting the analog output signal Ain" from the analog signal input circuit 140, the analog output signal AOUTC" from the analog signal input circuit 150, and the predictive integral signal AOUTB" from the predicting unit 600. The predictive addition unit 800 adds the output signal Ain" of the analog signal input circuit 140, the output signal AOUTC" of the analog signal input circuit 150 and the predictive integral signal AOUTB" of the predicting unit 600, and outputs the adding result AOUTD' to the quantization unit 40. The comparator 41 is input with the adding result AOUTD' of the predictive addition unit 800, and generates the quantization signal C with the adding result AOUTD' quantized. The comparator 41 quantizes the adding result AOUTD' input at the rising time of the clock signal PCOMP and generates the quantization signal C.

Figure 16:
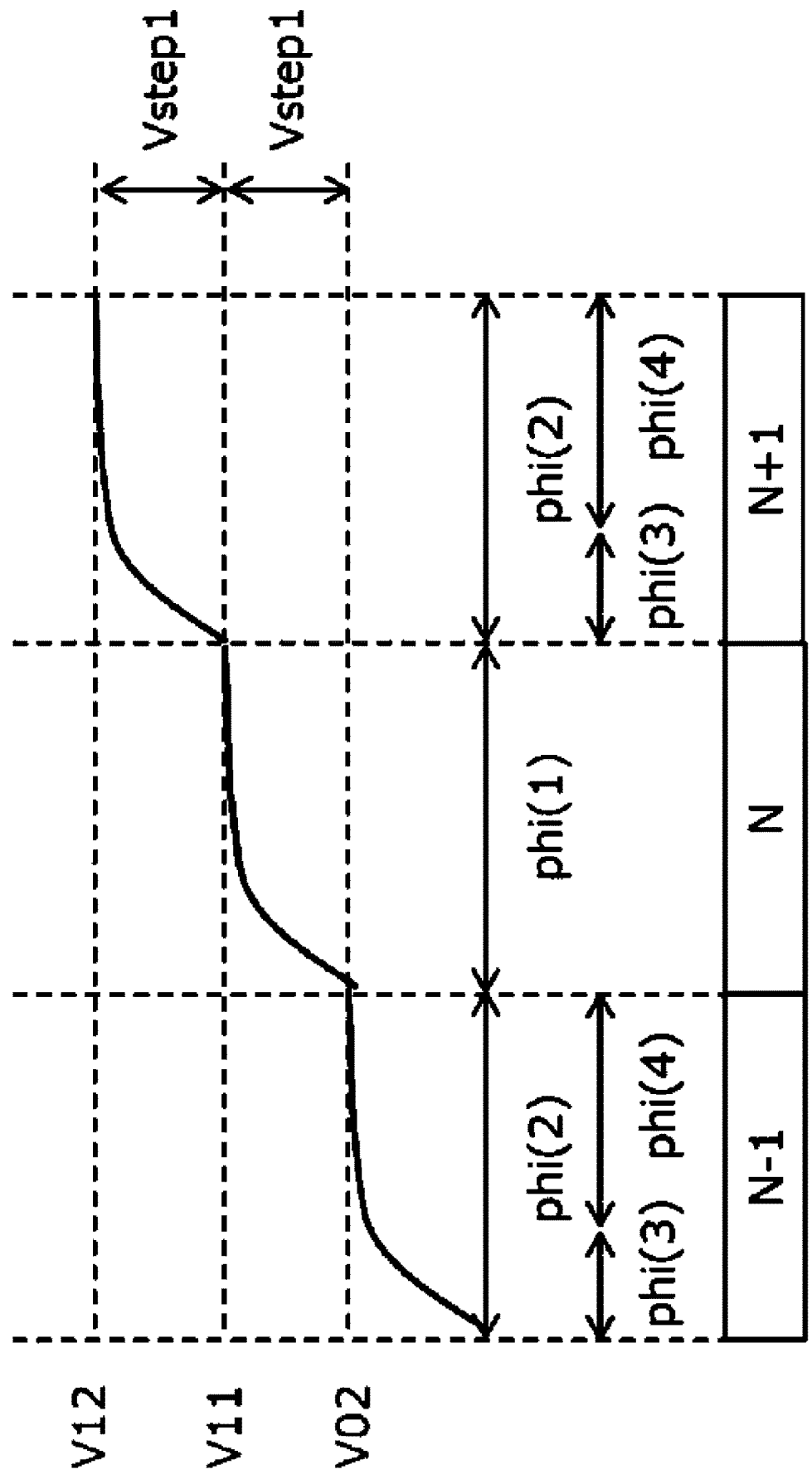
FIG. 16 illustrates a timing chart of an integral result AOUTB of the integral unit 30 in the AD converter 300.

FIG. 16 illustrates a timing chart of the integral result AOUTB of the integral unit 30 in the AD converter 300 according to the third embodiment including the predictive addition unit 800. In FIG. 16, the vertical axis indicates the voltage level of the integral signal AOUTB, and the horizontal axis indicates the time lapse.

V11 indicates the voltage level of the output signal AOUTB of the operational amplifier 31 when the integration is completed during the current (Nth) operating period phi(1), V02 indicates the voltage level of the output signal AOUTB of the operational amplifier 31 when the integration is completed during the previous ((N−1)th) operating period phi(2), V12 indicates the voltage level of the output signal AOUTB of the operational amplifier 31 when the integration is completed during the ((N+1)th) operating period phi(2). The operating period phi(2) is divided into a first half operating period phi(3) and a second half operating period phi(4). Vstep 1 is half of the changed amount of the voltage level of the output signal AOUTB of the operational amplifier 31 when performing one integration during the current operating period phi(1) and the next operating period phi(2). That is, Vstep 1 in Expression (1) in the description of the AD converter 100 in the first embodiment, V12 can be expressed as shown in Expression (2).

Herein, in accordance with the timing chart in FIG. 16, electric charges Q1 is expressed by Expression (3) in the AD converter 100 in the first embodiment, electric charges Q2 is expressed by Expression (4), electric charges Q3 is expressed by Expression (5), electric charges Q that has been obtained by synthesizing the electric charges Q1, electric charges Q2 and electric charges Q3 is expressed by Expression (6), which are output to the quantization unit 40 during the operating period phi(3) of the next operating period phi(2).

During the operating period phi(3) that is the first half of the next operating period phi(2), the predicting unit 600 in the present example generates the electric charges Q corresponding to the voltage level of the output signal AOUTB of the operational amplifier 31 when the integration is completed during the next operating period phi(2), and outputs the electric charges Q as the predictive integral signal AOUTB" to the quantization unit 40. The predicting unit 600 in the present example generates the predictive integral signal AOUTB" with the switched capacitor, it may also generate the predictive integral signal AOUTB" with the resistive division, amplifier or the like.

In the AD converter 300 according to the third embodiment including the predictive addition unit 800, during any period of the operating period phi(1), the operating period phi(2) and the operating period phi(3), the output signal AOUTB of the integral unit 30 and the output signal AOUTC of the integral unit 70 is not shorted via switch and capacitance. Therefore, the integral signal AOUTB of the integral unit 30 and the integral signal AOUTC of the integral unit 70 do not interfere with each other. As a result, the AD converter 300 according to the third embodiment including the predictive addition unit 800 can realize a higher S/N ratio than the AD converter 300 according to the third embodiment including the predictive addition unit 80.

Figure 17:
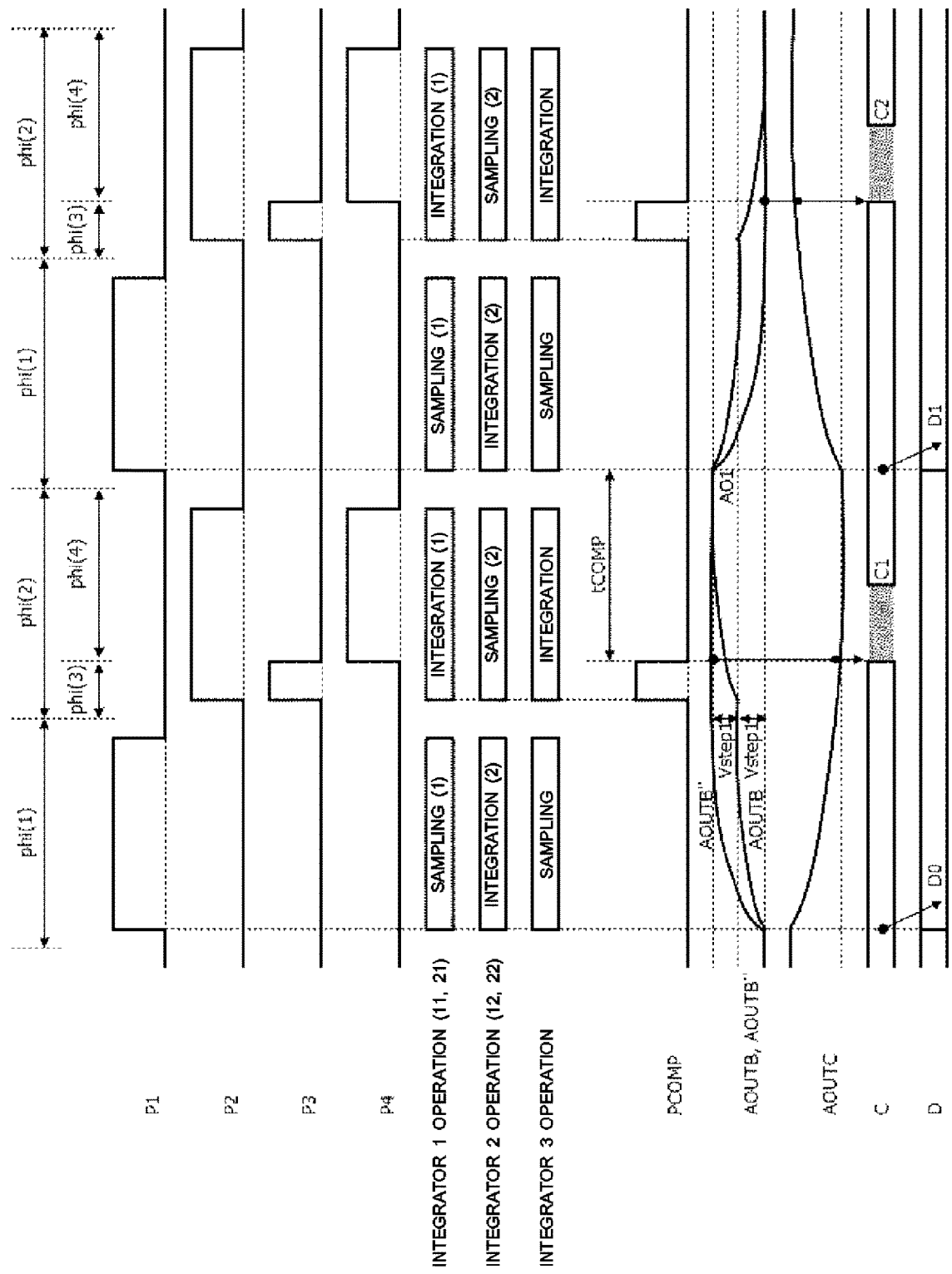
FIG. 17 illustrates one example of a timing chart of the AD converter 300.

FIG. 17 illustrates one example of a timing chart of the AD converter 300 according to the third embodiment including the predictive addition unit 800. The AD converter 300 including the predictive addition unit 800 in the present example operates to alternately repeat the operating period phi(1) and the operating period phi(2) in a time-divisional manner. The AD converter 300 including the predictive addition unit 800 operates the operating period phi(1) and the operating period phi(2) as one cycle. Although the operating period phi(1) and the operating period phi(2) in the present example are with an identical length, the operating period phi(1) and the operating period phi(2) may be with different lengths. The AD converter 300 including the predictive addition unit 800 in the present example operates to divide the operating period phi(2) into the first half operating period phi(3) and the second half operating period phi(4). The AD converter 300 including the predictive addition unit 800 in the present example divides the sampling operation into the sampling operation (1) and the sampling operation (2) and perform them. The AD converter 300 divides the integral operation into the integral operation (1) and the integral operation (2) and perform them.

The predictive addition unit 800 in the present example adds the analog output signal Ain' of the analog signal input circuit 140, the output signal AOUTC" of the analog signal input circuit 150 during the operating period phi(3) and the predictive integral signal AOUTB" of the predicting unit 600 of predicting the integral end value AO1 during the operating period phi(2), and generates the adding result AOUTD'. The control unit 50 causes the quantization unit 40 to perform quantization on the adding result AOUTD' of the predictive addition unit 800. The quantization unit 40 outputs the quantization signal C that has quantized the adding result AOUTD input at the falling timing of the clock signal PCOMP. The logic circuit 42 outputs the digital signal D input at the rising edge of the next clock signal P1 and holds the same output signal to the rising edge of the clock signal P1.

In the quantization unit 40, the power consumption changes according to the length of the period tCOMP. In the present specification, the period tCOMP is a period from the starting timing of the quantization operation to the timing to confirm the output signal in the quantization unit 40. For example, when the period tCOMP becomes longer, since the speed requirement to the quantization unit 40 is relaxed, the power consumption in the quantization unit 40 is reduced. The period tCOMP is a period from the falling timing of the clock signal PCOMP to the rising time of the clock signal P1.

Since the AD converter 300 according to the third embodiment including the predictive addition unit 800 starts the quantization at the falling timing of the clock signal PCOMP for the adding result AOUTD' of the predictive addition unit 800, the period tCOMP becomes shorter than the AD converter 300 according to the third embodiment including the predictive addition unit 80. Accordingly, the power consumption of the quantization unit 40 in the AD converter 300 according to the third embodiment including the predictive addition unit 800 increases when compared to the AD converter 300 according to the third embodiment including the predictive addition unit 80. Also, affected by the manufacturing process variations, power supply voltage fluctuations, and temperature fluctuations (PVT fluctuations), the clock signal PCOMP has the Duty fluctuation becoming apparent and the period tCOMP required for quantization being unable to be secured, which may be considered to make high-speed operation a challenge. In this case, it is possible to relax the Duty fluctuation by using the clock signal PCOM generated from the PLL circuit. On the other hand, the AD converter 300 according to the third embodiment including the predictive addition unit 800 can realize a higher S/N ratio than the AD converter 300 according to the third embodiment including the predictive addition unit 80.

The AD converters 100, 200 and 300 in the first embodiment to the third embodiment as described above can relax the thronging requirement of the integral unit 30 (that is, the output change speed requirement) and reduce the power consumption of the integral unit 30 by dividing one integration into multiple times. Furthermore, the AD converters 100, 200 and 300 can make the period from the starting timing of the quantization operation to the starting timing of the next integration longer and reduce the power consumption of the quantization unit 40 by performing the quantization using the predicted integral signal. By performing the quantization using the predicted integral signal, the AD converters 100, 200 and 300 can reduce the error for the integral completion value and reduce the error noise included in the quantized signal.

It should be noted that the logic circuit 42 may also be input with a rising clock signal, instead of the clock signal P1, at the timing that is slightly earlier than the rising edge of the clock signal P1 so as to avoid overlapping with the integral operation. Also, the switches SS1 and SS2 of the first reference signal input circuit 21 and the second reference signal input circuit 22 may be turned on at the same timing, or may be turned on with half-phase off. Similarly, the switches SS1B and SS2B may be turned on at the same timing, or may be turned on with half-phase off. Then, the selection of the switch SS1 and the SS1B may be performed with a signal for resynchronizing the digital signal D and the inverting signal DB at the rising edge of the clock signal P2 or at a slightly earlier timing.

The AD converters 100, 200 and 300 may have only one analog signal input circuit or one reference signal input circuit, or may be configured to divide only one of the analog output signal Aout and the feedback signal Sfb. Also, the AD converters 100, 200 and 300 may divide the analog output signal Aout and the feedback signal Sfb into three or six sections, or may have three or six analog signal input circuits and reference signal input circuits, respectively.

Also, the clock terminal of the logic circuit 42 may be input with the clock signal P2. The clock terminal of the logic circuit 42 may also be input with the clock signal rising earlier than the rising edge of the clock signal P1 so as to avoid overlapping with the integral operation.

Figure 18:
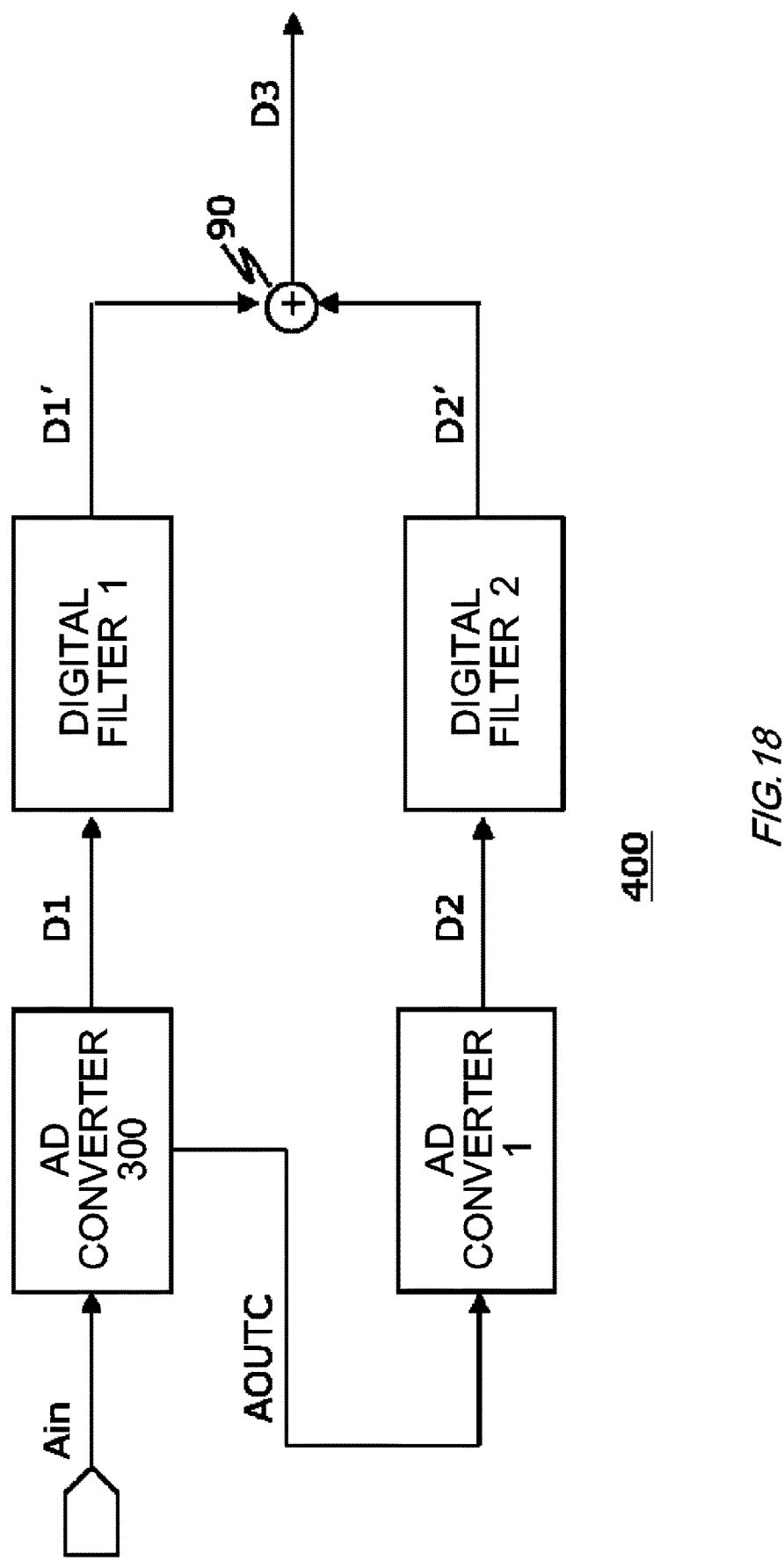
FIG. 18 illustrates an overview of a configuration of an AD conversion apparatus 400.

FIG. 18 illustrates an overview of the configuration of the AD conversion apparatus. The AD conversion apparatus 400 quantizes and outputs the input analog input signal Ain to the bit data. The AD conversion apparatus 400 includes an AD converter 410, an AD converter 420, a digital filter 430, a digital filter 440 and a noise canceling circuit 90. The AD converter 410 may be one of the AD converters 100, 200 and 300 in the first embodiment to the third embodiment. The AD converter 420 may be one of the AD converters 100, 200 and 300 in the first embodiment to the third embodiment without the predicting unit 60 and the predictive addition units 80, 800.

For example, the AD conversion apparatus 400 is a MASH (Multi-Stage Noise Shaping) modulator accordingly connecting the AD converter 410, as the first stage, and the AD converter 420, as the second stage. Also, the AD conversion apparatus 400 is an AD converter with a third-order delta-sigma modulator as one example.

The AD converter 410 is connected to the digital filter 430 and the AD converter 420. The AD converter 410 outputs the integral signal AOUTC to the AD converter 420 according to the input analog input signal Ain, and outputs the digital signal D1 to the digital filter 430 according to the signal with the adding result AOUTD quantized. The AD converter 420 is connected to the digital filter 440. The AD converter 420 quantizes the signal output by the integrator of the AD converter 420 and outputs the digital signal D2 according to the input of the predictive integral signal AOUTD.

The digital filter 430 is connected to the noise canceling circuit 90, and multiplies the input digital signal D1 by the coefficient H1 and outputs the digital signal D1'. The digital filter 440 is connected to the noise canceling circuit 90, and multiplies the input digital signal D2 by the coefficient H2 and outputs the digital signal D2'. The noise canceling circuit 90 is input with the digital signal D1' and the digital signal D2'. The noise canceling circuit 90 subtracts the digital signal D2' from the digital signal D1' and outputs the digital signal D3. The coefficient H1 of the digital filter 430 and the coefficient H2 of the digital filter 440 may be selected to be used in the digital signal D3, which is the output signal of the noise canceling circuit 90, to cancel out the quantization noise of the AD converter 410 in the first stage.

The AD conversion apparatus 400 applies the AD converters 100, 200 and 300 in the first embodiment to the third embodiment as the first stage of the MASH converter. For example, to predict, generate and quantize the second integral result at the timing when the first integral result is output, the AD converter 100 does not include the output digital signal D1 and D1' in the error signal. Therefore, in the noise canceling circuit 90, no quantization noise of the AD converter 410 of the first stage remains in the result of subtracting the digital signal D2' from the digital signal D1'. If an AD converter 420, without a predicting unit 60, is applied as the first stage of the MASH converter, since the signal in the middle of the second integration is used for quantization, an error signal is included in the output digital signal. As a result, in the noise canceling circuit 90, a quantization noise of the AD converter 410 of the first stage remains in the result of subtracting the digital signal D2' from the digital signal D1'. Accordingly, by applying the AD converters 100, 200 and 300 of the first embodiment to the third embodiment as the first stage of the MASH converter, a higher S/N ratio can be realized.

It should be noted that in the first stage of the MASH converter in the AD conversion apparatus 400, the AD converter 300 according to the third embodiment may also be applied. By applying the high-order delta-sigma modulator such as the AD converter 300 according to the third embodiment, the quantization noise can be moved to the high frequency side and a higher S/N ratio can be realized. Also, even in the second stage of the MASH converter in the AD conversion apparatus 400, any one of the AD converters 100, 200 and 300 in the first embodiment to the third embodiment may be applied.

Although the predicting unit of the above-mentioned AD converters 100, 200 and 300 has output the predictive integral signal based on the integral signal during two periods that are consecutive among X periods divided from the conversion period, it is not limited thereto, that is, a predictive integral signal may also be output similarly based on the integral signal of two periods that are not consecutive (for example, a difference of two integral signals).

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. An AD converter, comprising:
   an analog signal input circuit, configured to be input with an analog input signal, and output a first analog output signal based on the analog input signal and a second analog output signal based on the analog input signal at different timing;
   an integral circuit, configured to integrate the first analog output signal and the second analog output signal to output the first integral signal and the second integral signal;
   a predictive circuit, configured to predict an integral signal output after the output by the integral circuit based on the first integral signal and the second integral signal output by the integral circuit, and output a predictive integral signal; and
   a quantization circuit, configured to generate a digital signal with the predictive integral signal quantized.

2. The AD converter according to claim 1, wherein the predictive circuit is configured to predict the integral signal that is output after the output of the integral circuit based on a difference between the first integral signal and the second integral signal output by the integral circuit at different timing.

3. The AD converter according to claim 1, wherein the predictive circuit has three capacitors connected in parallel, a plurality of switches for switching a connection to one end side of the three capacitors between an output of the integral circuit and reference potential, and a plurality of switches for switching a connection to another end side of the three capacitors between an output of the predictive circuit and reference potential.

4. The AD converter according to claim 1, wherein:
   the analog signal input circuit includes:
      a first analog signal input circuit, configured to be input with the analog input signal and output the first analog output signal; and
      a second analog signal input circuit, configured to be input with the analog input signal at timing different from the first analog signal input circuit, and output the second analog output signal; and
   the first analog signal input circuit and the second analog signal input circuit are commonly connected to the integral circuit.

5. The AD converter according to claim 4, configured to repeat a first operating period for integrating the first analog output signal with the integral circuit and a second operating period for integrating the second analog output signal with the integral circuit in a time-divisional manner.

6. The AD converter according to claim 5, wherein:
   during the first operating period, the first analog signal input circuit is configured to output the first analog output signal to the integral circuit, and the second analog signal input circuit is configured to sample the analog input signal; and
   during the second operating period, the first analog signal input circuit is configured to sample the analog input signal, and the second analog signal input circuit is configured to output the second analog output signal to the integral circuit.

7. The AD converter according to claim 6, wherein the predictive circuit is configured to predict one of the first integral signal and the second integral signal, which are output next to the output of the integral circuit, based on the first integral signal and the second integral signal output at different timing by the integral circuit.

8. The AD converter according to claim 1, comprising:
   a third analog signal input circuit, configured to output a third analog output signal based on an integral signal output after the output of the integral circuit;
   a second integral circuit, configured to integrate the third analog output signal to output a third integral signal; and
   an adding circuit, configured to add the analog input signal and the third integral signal to the predictive integral signal, and output the added predictive integral signal to the quantization circuit.

9. The AD converter according to claim 8, comprising:
   a fourth analog signal input circuit, configured to output a fourth analog output signal to the adding circuit according to the analog input signal that is input; and a fifth analog signal input circuit, configured to output a fifth analog output signal to the adding circuit according to the third integral signal, wherein the adding circuit is configured to add the fourth analog output signal and the fifth analog output signal to the predictive integral signal and output the added predictive integral signal to the quantization circuit.

10. An AD converter, configured to divide an Mth (M is an integer equal to or greater than 2) conversion period into X periods (X is an integer equal to or greater than 2), and repeatedly perform an integral operation and a sampling operation during the conversion period, comprising:

an analog signal input circuit, configured to output an analog output signal based on an input analog input signal that is input, respectively, during each of the X periods equally divided from the conversion period;

an integral circuit, configured to integrate an output of the analog signal input circuit;

a predictive circuit, configured to:

predict an integral signal output from the integral circuit during a last (Xth) period of the Mth conversion period divided into the X periods, based on an integral signal output from the integral circuit during a last (Xth) period of an immediately preceding ((M−1)th) conversion period divided into X periods and an integral signal output from the integral circuit in one of (1st to (X−1)th) periods other than the last (Xth) period of the X periods divided from the Mth conversion period, or each integral signal of two different periods in one of the (1st to (X−1)th) periods other than the last (Xth) period of the X periods divided from the Mth conversion period, and output a predictive integral signal; and a quantization circuit, configured to generate a digital signal with the predictive integral signal quantized.

11. The AD converter according to claim 10, wherein the predictive circuit is configured to predict the integral signal output from the integral circuit during the last (Xth) period, based on a difference between an integral signal output from the integral circuit during the last (Xth) period of the immediately preceding ((M−1)th) conversion period divided into the X periods and the integral signal output from the integral circuit in one of the (1st to (X−1)th) periods other than the last (Xth) period of the X periods divided from the Mth conversion period, or a difference of the each integral signal of two different periods in one of the (1st to (X−1)th) periods other than the last (Xth) period of the X periods divided from the Mth conversion period.

12. The AD converter according to claim 10, wherein the predictive circuit has three capacitors connected in parallel, a plurality of switches for switching a connection to one end side of the three capacitors between an output of the integral circuit and reference potential, and a plurality of switches for switching a connection to other end side of the three capacitors between an output of the predictive circuit and reference potential.

13. The AD converter according to claim 10, wherein:

the analog signal input circuit includes:

a first analog signal input circuit, configured to be input with the analog input signal and output a first analog output signal; and a second analog signal input circuit, configured to be input with the analog input signal at timing different from the first analog signal input circuit, and output a second analog output signal; and the first analog signal input circuit and the second analog signal input circuit are commonly connected to the integral circuit.

14. The AD converter according to claim 13, wherein:

during an L1th period (L1 is an integer equal to or greater than 1 and equal to or smaller than X−1), the first analog signal input circuit is configured to output the first analog output signal to the integral circuit, and the second analog signal input circuit is configured to sample the analog input signal; and during an L2th period (L2 is an integer greater than L1 and equal to or smaller than X−1), the first analog signal input circuit is configured to sample the analog input signal, and the second analog signal input circuit is configured to output the second analog output signal to the integral circuit.

15. The AD converter according to claim 10, comprising:

a third analog signal input circuit, configured to output a third analog output signal, based on an integral signal output from the integral circuit during a last (Xth) period of X divided periods;

a second integral circuit, configured to integrate the third analog output signal to output a third integral signal; and an adding circuit, configured to add the analog input signal and the third integral signal to the predictive integral signal, and output the added predictive integral signal to the quantization circuit.

16. The AD converter according to claim 15, comprising:

a fourth analog signal input circuit, configured to output a fourth analog output signal to the adding circuit according to the analog input signal that is input; and a fifth analog signal input circuit, configured to output a fifth analog output signal to the adding circuit according to the third integral signal, wherein the adding circuit is configured to add the fourth analog output signal and the fifth analog output signal to the predictive integral signal and output the added predictive integral signal to the quantization circuit.

\* \* \* \* \*